(12) United States Patent
Nishizawa et al.

(10) Patent No.: US 6,531,773 B2
(45) Date of Patent: Mar. 11, 2003

(54) SEMICONDUCTOR DEVICE

(75) Inventors: Hirotaka Nishizawa, Fuchu (JP);
Masachika Masuda, Tokorozawa (JP);
Kouichi Kanemoto, Koganei (JP);
Tamaki Wada, Higasimurayama (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 09/930,942

(22) Filed: Aug. 17, 2001

(65) Prior Publication Data
US 2002/0030270 A1 Mar. 14, 2002

Related U.S. Application Data

(63) Continuation of application No. 09/797,719, filed on Mar. 5, 2001.

(30) Foreign Application Priority Data

Mar. 3, 2000 (JP) .................................. 2000-063285

(51) Int. Cl.[7] .............................................. H01L 23/34
(52) U.S. Cl. ...................... 257/723; 257/685; 257/737; 257/777
(58) Field of Search ................................ 257/685, 686, 257/723, 737, 738, 777, 778, 780; 365/185.29, 185.33, 226; 371/40.18, 51.1

(56) References Cited

U.S. PATENT DOCUMENTS

| | | | | |
|---|---|---|---|---|
| 5,754,567 A | * | 5/1998 | Norman | 365/185.09 |
| 6,100,594 A | * | 8/2000 | Fukui et al. | 257/685 |
| 6,125,061 A | * | 9/2000 | Mitani | 365/185.29 |
| 6,157,080 A | * | 12/2000 | Tamaki et al. | 257/738 |
| 6,265,783 B1 | * | 7/2001 | Juso et al. | 257/738 |

FOREIGN PATENT DOCUMENTS

| | | |
|---|---|---|
| JP | 11-86546 | 7/1989 |
| JP | 5-13662 | 1/1993 |
| JP | 6-250799 | 9/1994 |
| JP | 8-316407 | 11/1996 |
| JP | 9-508496 | 8/1997 |
| JP | 11-019370 | 1/1999 |
| JP | 11-163255 | 6/1999 |
| JP | 11-354714 | 12/1999 |

OTHER PUBLICATIONS

Japanese Journal "Nikkei Microdevices", Aug. 1999, pp. 40–45.

* cited by examiner

Primary Examiner—David Nelms
Assistant Examiner—Dao H. Nguyen
(74) Attorney, Agent, or Firm—Antonelli, Terry, Stout & Kraus, LLP

(57) ABSTRACT

A chip mounting method is proposed which considers facilitating the testing of semiconductor chips when a plurality of semiconductor chips are sealed in a single resin sealing body. This method also considers its application to a variety of MCPs and system LSIs. In a single package, one signal output terminal of the first semiconductor chip and a first external terminal of the semiconductor device are internally connected independently. One signal input terminal of the second semiconductor chip and a second external terminal of the semiconductor device are internally connected independently. The first and second external terminals of the semiconductor device are connected outside of the semiconductor device to complete the connection between the signal output terminal and the signal input terminal.

41 Claims, 22 Drawing Sheets

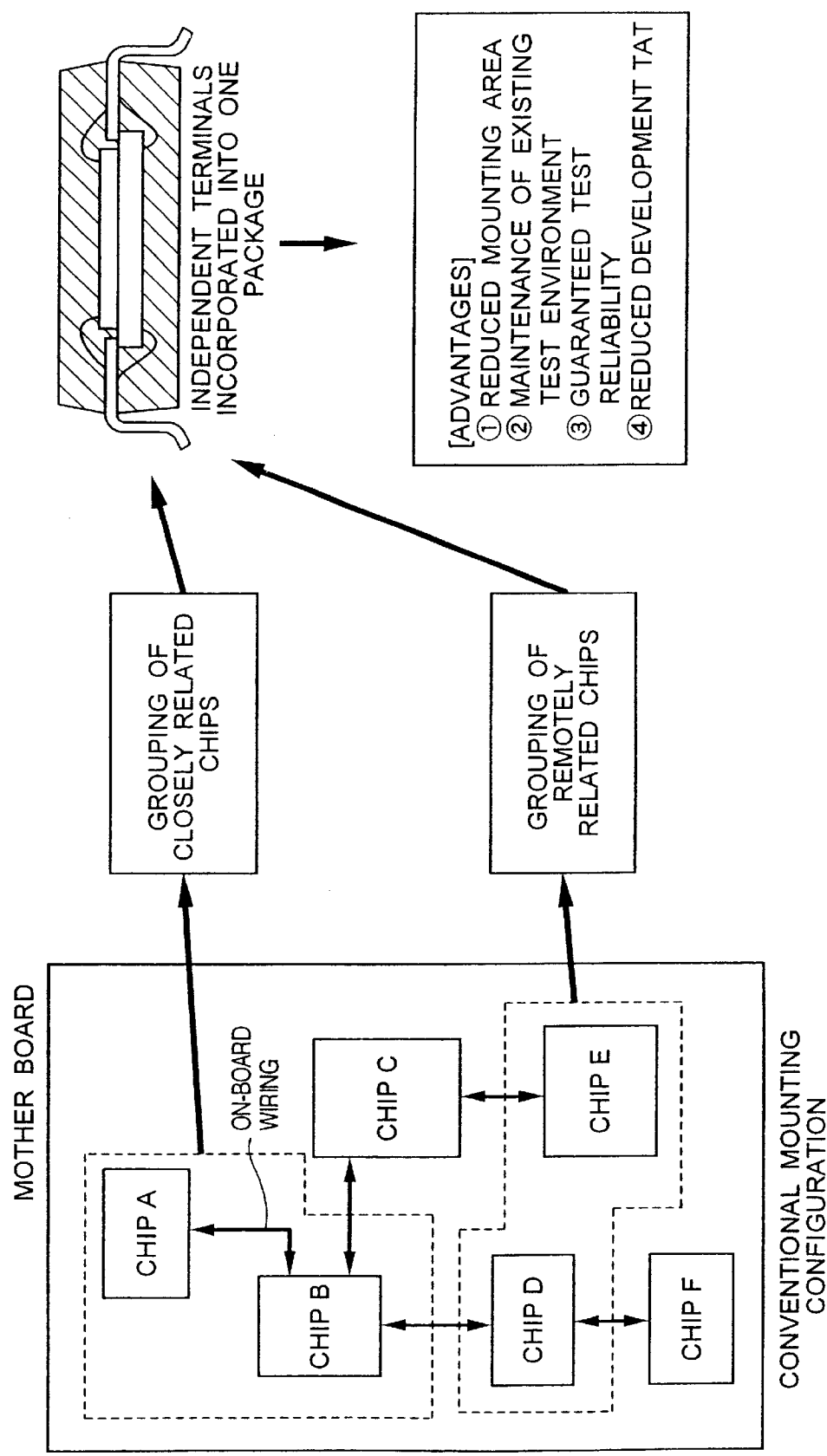

SEMICONDUCTOR DEVICE

This application is a Continuation application of application Ser. No. 09/797,719, filed Mar. 5, 2001.

BACKGROUND OF THE INVENTION

The present invention relates to an MCP (Multi-Chip Package) type semiconductor disk device capable of expanding memory and to a semiconductor device with provisions to facilitate testing a plurality of chips accommodated in an MCP (Multi-Chip Package).

As demands are growing for higher integration density of semiconductor devices mounted on a printed circuit board, the packages of semiconductor devices are getting smaller. In recent years, a variety of kinds of CSPs (chip size packages), a general reference to packages equal to or slightly larger than the chip size, have been developed. (The CSP package type is classified as a derivative of the existing packages.) They are making large contributions to reducing size and weight of portable terminals.

At the same time, since the speed at which the memory capacity required by the system devices increases is higher than the speed at which the memory integration improves, a three-dimensional mounting of a memory has been proposed as a means to increase the memory capacity while minimizing an increase in the memory mounting area. The application of this invention developed a technology of DDP (Double Density Package) in which an LOC (Lead On Chip) structure is formed in layers to double the memory capacity of a package with the same external size as the 1-mm-thick surface mount package TSOP (see JP-A-11-163255, laid open on Jun. 18, 1999, corresponding to U.S. patent application No. 09/161725 filed on Sep. 29, 1998). This publication discloses a 128 MDRAM-DDP, in which LOC structure (64MDRAM) lead frames are stacked in layers and sealed with a mold, with the leads bonded.

Unlike a conventional magnetic disk device, a semiconductor disk device using a flash memory has no mechanical moving parts, and thus is unlikely to have erroneous operations and failures due to physical impacts. It has the advantages of being smaller in device size and able to make a faster read/write access to data than in the conventional magnetic disk device. The semiconductor disk device has conventionally been realized as a memory board or memory card having a plurality of flash memories and a controller that controls the flash memories. In this case, the plurality of flash memories are realized as discrete LSIs and the controller is also realized as one LSI.

To deal with the aforementioned problem that a large number of parts in the semiconductor disk device makes the size reduction difficult, JP-A-6-250799, laid open on September 9, 1994, discloses a semiconductor disk device in which a flash memory unit, an interface with external devices, and a controller unit are integrated in a single LSI. The semiconductor disk device of a one-semiconductor-chip configuration has an expansion memory interface which, when the user wishes to expand the flash memory built into the chip, allows the storage capacity of the semiconductor disk device to be increased, as required, by the user externally connecting a flash memory one chip at a time.

JP-A-11-86546, laid open on Mar. 30, 1999, discloses a technology whereby a logic chip and a memory chip, fabricated separately, are mounted parallelly and sealed in one package. Further, JP-A-11-19370 (corresponding to U.S. Patent Application No. 09/450676, filed on Nov. 30, 1999) shows an example structure of MCP.

SUMMARY OF THE INVENTION

The inventors of this invention studied a semiconductor disk device suited for incorporation into various portable information terminals (palm size PC, handy terminal, etc.) and digital cameras as main products to which the invention can be applied. The specifications require the semiconductor disk device to have the smallest possible mounting area, weight and power consumption. A controller is available in a variety of kinds for various applications. For security reasons, the controller is expected to have its specification updated frequently, so that it is important to shorten the development period of new package products to reduce cost—the common priority among the commercial products.

When a semiconductor disk device disclosed in JP-A-6-250799 is to be manufactured in a single semiconductor chip configuration, i.e., in the form of a system LSI, the following problems may arise: (1) there is a need to develop a new process, which in turn increases the number of processes, leading to an increase in cost; (2) when all the constitutional units are manufactured by the same process, the performances of the individual units may become worse than when the individual units are fabricated in the dedicated processes; (3) redesigning the entire chip as a result of changes in the specifications of the controller unit is not advantageous in terms of reducing the development cost and shortening the development TAT; and (4) because the constitutional units are arranged two-dimensionally, the size becomes large for a single chip.

In the LSI incorporated into a single package by arranging a plurality of chips parallelly as described in JP-A-11-86546, the reduction in the mounting area remains small to an extent that the mounting area is not smaller than the sum of the areas of the individual chips.

(1) A first object of the present invention is to propose a package configuration for the semiconductor disk device, which has a small mounting area to facilitate its incorporation into small portable information terminals, and which can cope quickly with type changes of the controller due to specification changes, reduce the development TAT (Turn Around Time: time spent from the material processing to the delivery of a product; or number of days from the start of development to the completion of development) and keep the development cost low.

Further, in a proposal to construct a semiconductor disk device in the MCP configuration, the inventors of this invention studied the problems experienced when conducting tests on a product incorporating a memory chip and a controller chip in a single package. The existing memory and controller (logic) are individually packaged and subjected to tests individually before being mounted on the printed circuit board. When combining two chips and forming them as a single package product, it is natural to conceive also bringing into the package the "wiring" that is on the printed circuit board between the memory and the controller. This, however, poses a problem in the testing that is conducted before shipping of the product. When the existing memory and controller are tested as individual single packages, the memory is tested by a memory tester and the controller is tested by a logic tester. These existing test environments, however, cannot be used under the same conditions as in the conventional tests if the memory and the controller are incorporated into one package and internally interconnected as described above. When for example the memory is tested by the memory tester, the influence (leakage current) due to internally connecting the controller cannot be precluded entirely, so that the identical test cannot be conducted under the conventional memory testing environment. The same can be said of the testing of the controller. That is, even if the influences of the internal connection is reduced as much as possible and an analysis considering these influences is performed, the equality of the test is expected to deteriorate.

Further, the memory tester and the logic tester have different characteristics. As the memory capacity increases, the test time also increases. To deal with this situation the memory tester enhances the test productivity by testing a large number of memories simultaneously. As for the logic tester, on the other hand, although it uses many signal terminals for applying a very large test pattern to the LSI being tested, the test time is generally about two orders of magnitude smaller than the memory test time. Because of this characteristic, the logic tester enhances the test productivity by increasing the rate at which the LSIs are mounted and tested. If a mixed tester having both of these test functions with different characteristics is developed, the MCP packages mounted on the mixed tester may be able to be subjected to both of these test functions. However, there is a drawback that until the memory test is completed after the logic test has been finished, the logic test terminals become idle without being utilized, eventually degrading the test productivity.

Hence, in view of the test productivity, i.e., efficient utilization of the expensive test system, it is considered promising to test the memory chip and the logic chip in the MCP two times individually. To realize this, it may be necessary to add to the memory tester and the test packages a function of isolating the influences due to connecting the controller and to add to the logic tester and the test packages a function of isolating the influences due to connecting the memory.

Therefore, (2) it is the second object of this invention to propose an MCP mounting configuration which can efficiently utilize the expensive test system originally constructed to deal with individual separate chips in a conventional manner, keep low the cost and the number of processes for the development of new test environments, and shorten the product development TAT.

(3) Further, it is checked whether the solution described above (2) that considers the efficiency of the development of test environment can be applied generally to a wide range of MCPs if the types of chips to be combined, the functions to be incorporated, and the package configuration should change.

(4) Further, it is also checked whether the present invention can similarly be applied to the system LSIs considering the problems accompanying the development of the test environment for a plurality of LSI cores.

When the mounting configurations suited for the semiconductor disk device for incorporation into a variety of portable information terminals and digital cameras are evaluated in terms of (1) small mounting area and (2) low manufacturing cost, if the chip area is 40 mm$^2$ or greater, it is considered better to mount the memory chip and the controller chip in a stacked package (three-dimensional mounting) rather than integrating them into a one-chip system LSI (see Nikkei Microdevices, August 1999, pp. 40–45). Hence, let us consider a case where a plurality of different kinds of chips (e.g., a combination of a memory chip and a controller chip) are three-dimensionally mounted in one package. Normally, these chips have different shapes and different electrode pad arrangements and thus the package configuration in this case differs from the one in which a plurality of chips of the same shape and the same specifications are stacked as in the DDP and stack memory. Among the package types currently in wide use, the following two types may be selected considering the ability to reduce the manufacturing cost by using the existing facilities and realize a significant mounting area reduction effect.

(1) TQFP (Thin Quad Flat Package) type of four-directional lead arrangement structure in which a second semiconductor chip is stacked on a semiconductor chip of LOC (Lead On Chip) structure.

(2) Stacked chip CSP (Chip Size Package) type based on a small BGA (Ball Grid Array).

The CSP type has a better mounting area reduction effect but, in terms of the short development period for product design and the low manufacturing cost, the TQFP type using the low-cost lead frame is superior.

Among the package configurations for the semiconductor disk device suited for incorporation into various portable information terminals and digital cameras, the first proposed solution is a TQFP type which has a short development period for product design achieved by combining the existing chips and packaging them and which has the lowest manufacturing cost realized by stacking a plurality of chips on a single lead frame. The TQFP type will be disclosed in the first embodiment. As for the expansion of the memory in the semiconductor disk device, the package is provided with a memory expansion terminal. This embodiment has specifications that allow the controller to access the externally connected expansion memory in the same way as accessing the built-in memory.

Facilitating the testing of a plurality of chips incorporated in the MCP, which is the second object of the present invention, is proposed as follows.

In the embodiment 1, the controller and the flash memory in the package constituting the semiconductor disk device are basically not internally connected. The electrode pads of the controller chip and the flash memory chip are independently connected to the external terminals. The power supply or ground may be connected to a common external terminal of the two chips. When the semiconductor disk device described above is in use, it is mounted on the board and its external terminals are interconnected by wires on the board. The controller accesses the flash memory via the external terminals and the wires on the board.

With this arrangement, the flash memory and the controller in the package of this invention, when viewed from outside the package, operate independently of each other through the external terminals. Hence, by mounting the packages of this invention in the test environment that was originally developed for testing the conventional discrete chips, the memory test and logic test can be executed successively in the same way as with the individual discrete chips. With the method of this invention, reliable tests identical with the conventional ones can be performed without adding to the memory and logic test environments a function of isolating the influences of other chips.

The MCP configuration of this invention that enables independent tests is not limited to the MCP of the embodiment 1 having a combination of the flash memory and the controller (ASIC) but can be applied, with the similar effects, to any MCPs in any form of package with any number of combined chips.

As a variation of this invention, it is possible to provide a selector on the internal wires between a plurality of chips in the MCP and to supply a test mode signal from the external terminal to the selector to select between two modes, a mode in which the plurality of chips are disconnected from each other and can be independently tested from the external terminals and a mode in which the plurality of chips are internally interconnected to allow inter-chip accesses inside the package. In this case, a selector with a function of connection switching according to the mode signal is installed on the internal wires in the package or in the controller chip.

A package is provided which incorporates into a flash memory a system program conforming to the combination of a flash memory and a controller and which guarantees that the system program operates normally.

BRIEF DESCRIPTION OF THE DRAWINGS

FIG. 17 is a diagram showing how independent terminals of a plurality of chips are integrated into one package.

DESCRIPTION OF THE EMBODIMENTS

Figure 1:
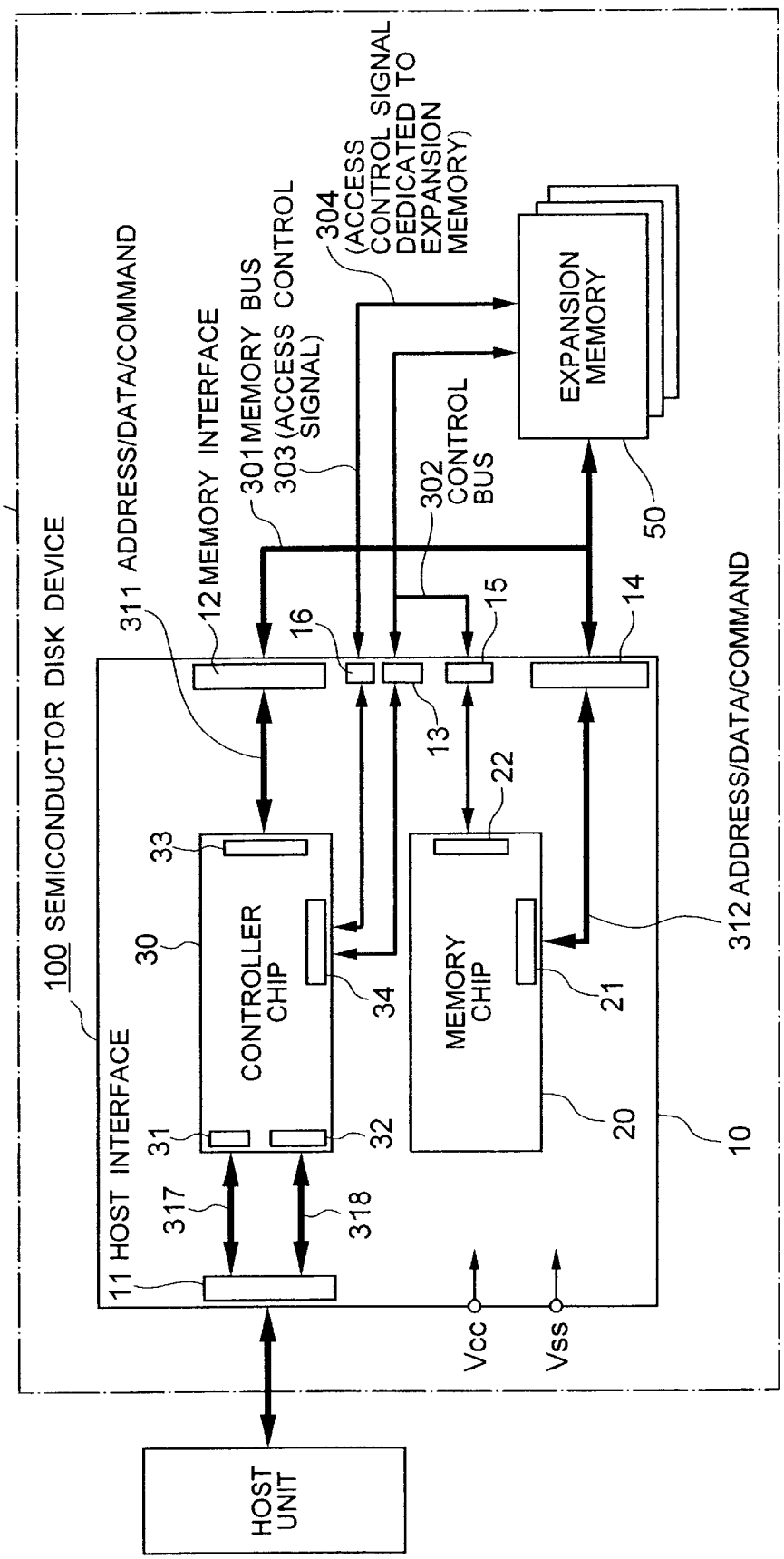
FIG. 1 is a block diagram of a semiconductor disk device according to an embodiment of this invention.

Now, embodiments of this invention will be described in detail by referring to the accompanying drawings. Throughout all the drawings showing example embodiments of the invention, components having identical functions are assigned like reference numerals and their repetitive explanations are omitted.

(Embodiment 1)

FIG. 1 shows a block diagram of a semiconductor disk device 100 constructed of a single semiconductor package 10 according to the present invention. A memory chip 20 and a controller chip 30, both making up the semiconductor disk device 100, are not internally connected in the semiconductor package 10 but their signal terminals (a plurality of electrode pads are hereinafter generally called "electrode pads 21, 22, 31–34") are independently and internally connected to external terminal blocks 11–16 (each external terminal block consists of a plurality of external terminals and these external terminal blocks are hereinafter generally called "external terminals"). That is, the controller chip 30 has an electrode pad 31 for transferring address/various access signals to and from an external host unit and an electrode pad 32 for transferring data/command signals to/from the external host unit. These electrode pads 31, 32 are internally connected by 317, 318 to an external terminal 11 (host interface) for connection with the host unit of the semiconductor package 10 to output address/data/command signals to the memory. The controller chip 30 also has an electrode pad 33 for inputting data signals from the memory and an electrode pad 34 for inputting and outputting memory access control signals. The electrode pad 33 is internally connected to an external terminal 12 (memory interface) of the semiconductor package 10 and the electrode pad 34 is internally connected to external terminals 13, 16 for access control signals of the semiconductor package 10. As to the memory chip 20, an electrode pad 21 for inputting address/data/command signals from the controller chip 30 and outputting data signals to the controller chip 30 is internally connected to an external terminal 14 of the semiconductor package 10; and an electrode pad 22 for inputting and outputting access control signals to and from the controller is internally connected to an external terminal 15 that handles access control signals of the semiconductor package 10. As to other signals, power supply (Vcc) and ground (Vss), for the input/output of which the controller chip 30 and the memory chip 20 are required-to connect to external circuits outside the semiconductor package 10, other electrode pads of the controller chip 30 and memory chip 20 are internally connected to other external terminals of the semiconductor package 10. In that case, the electrode pads for the ground (Vss) and power supply (Vcc) may be connected to common external terminals or a part of the signals may be connected to common external terminals. Or they may be internally connected.

The semiconductor package 10 according to an embodiment of this invention is mounted on a mother board 150, and the external terminal 12 (memory interface) and the external terminal 14 of the semiconductor package 10 are externally connected by a memory bus 301 on the board. Similarly, the external terminal 13 and the external terminal 15 of the semiconductor package 10 are externally connected by a control bus 302 on the board 150. With the controller chip 30 and the memory chip 20 interconnected in this way, the access control of the semiconductor disk device can made.

By avoiding the internal connection between the controller chip 30 and the memory chip 20 in the semiconductor package 10 as much as possible, a test on individual chips using a test system through the external terminals can be performed while minimizing influences from other chips. This enhances the reliability of the test.

Further, to enable an expansion of the memory capacity, the semiconductor disk device 100 according to an embodiment of this invention is provided with a memory expansion terminal 16, to which an expansion memory 50 can be externally connected so as to be accessed by the controller chip 30. The memory expansion is realized by connecting the expansion memory 50 mounted on the mother board 150 to the memory bus 301 and the control bus 302—which interconnect the controller chip 30 and the memory chip 20—in the same hierarchy (a form of connection that supplies the address and various control signals commonly). A part of an access control signal 303 is not only transferred between the controller chip 30 and the built-in memory chip 20 but also to the expansion memory 50. An access control signal 304 dedicated for the expansion memory is directly transferred from the controller chip 30 through the memory expansion terminal 16 to the expansion memory 50. Which of the built-in memory 20 and the expansion memory 50 is to be accessed is determined by which of chip enable signals F_CEA_1–F_CEA_5 described later is generated. The expansion memory 50 may be mounted as a package which contains one or more memory chips, each having the same specification as or different capacity from the built-in memory 20.

Figure 2:
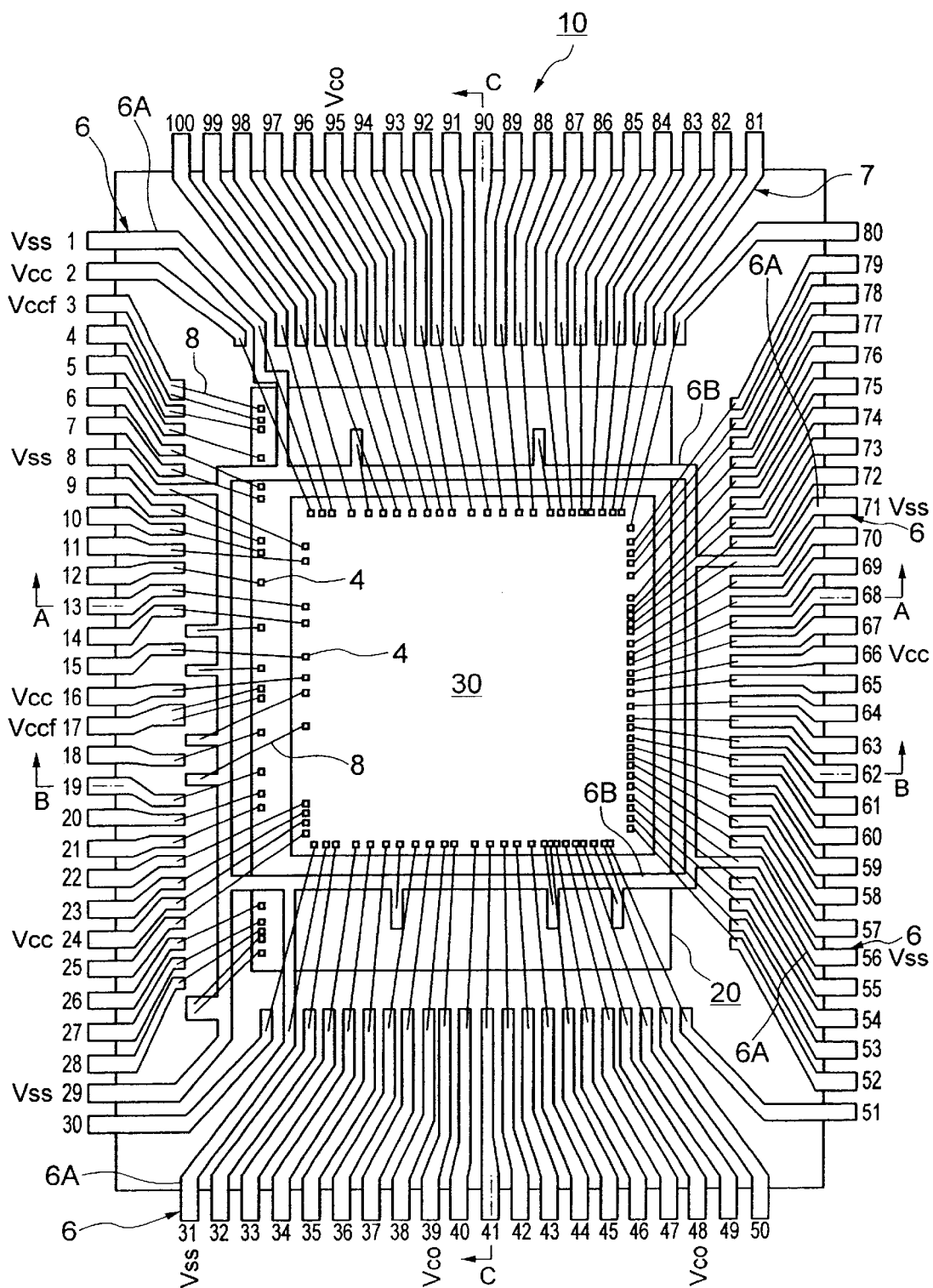
FIG. 2 is a plan view of the semiconductor disk device according to an embodiment of this invention with the top portion of a resin sealing body removed.
Figure 3:
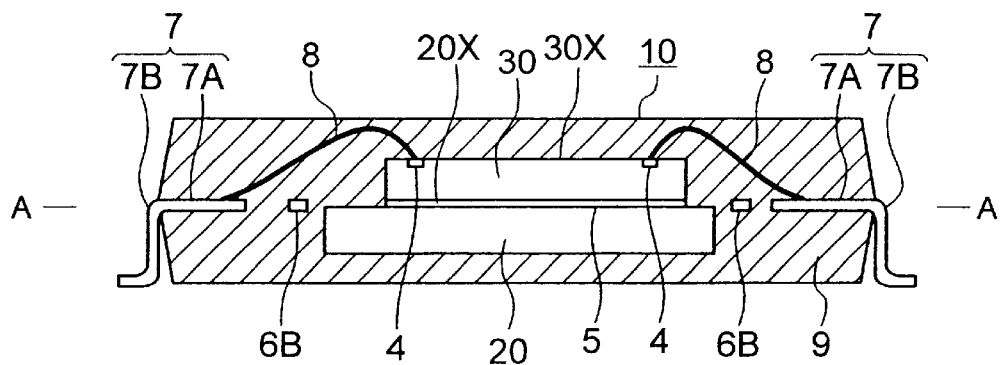
FIG. 3 is a schematic cross section taken along the line A—A of FIG. 2.
Figure 4:
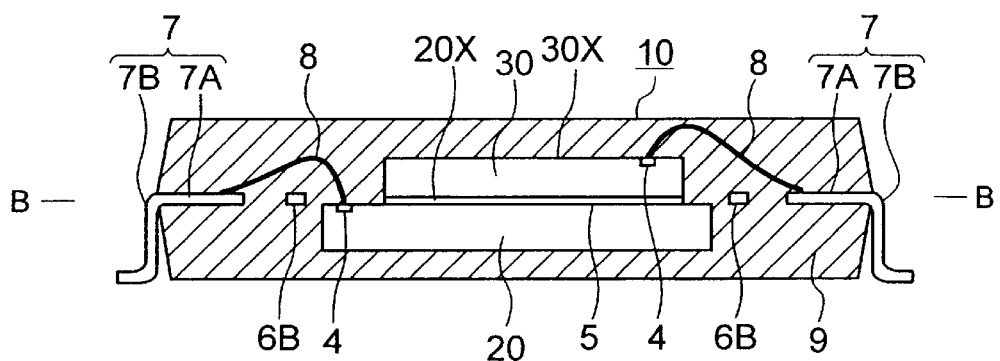
FIG. 4 is a schematic cross section taken along the line B—B of FIG. 2.
Figure 5:
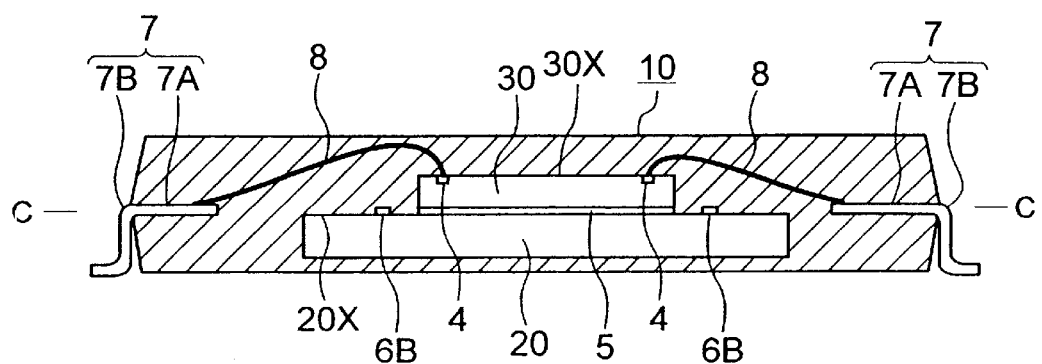
FIG. 5 is a schematic cross section taken along the line C—C of FIG. 2.

FIG. 2 shows an example of the semiconductor disk device 100 according to an embodiment of this invention formed in a single semiconductor package 10. FIG. 2 is a plan view of TQFP (Thin Quad Flat Package) type semiconductor package 10 of a 4-way lead array structure with the top portion of a resin sealing body removed. FIG. 3 is a schematic cross section taken along the line A—A of FIG. 2. FIG. 4 is a schematic cross section taken along the line B—B of FIG. 2. FIG. is a schematic cross section taken along the line C—C of FIG. 2.

As shown in FIG. 2, FIG. 3, FIG. 4 and FIG. 5, the semiconductor disk device 100 of the embodiment 1 has: a controller chip 30 having a plurality of electrode pads 4 formed on a principal surface 30X of a square semiconductor substrate; a memory chip 20 having a plurality of electrode pads 4 formed on a principal surface 20X of a square semiconductor substrate larger than the semiconductor substrate of the controller chip 30; a plurality of leads 7 arranged around the outer peripheries of the controller chip 30 and the memory chip 20, the leads 7 each consisting of an inner portion 7A and an outer portion 7B, the inner portions 7A being electrically connected to the electrode pads 4 of the controller chip 30 and memory chip 20 through conductive wires 8; a support lead 6 for supporting the memory chip 20; and a resin sealing body 9 sealing the controller chip 30, memory chip 20, wires 8 and inner portions 7A of the leads 7.

The support lead 6 has suspension lead portions 6A and a semiconductor chip support lead portion (bus bar) 6B integrally formed, the suspension lead portions 6A being arranged between lead groups each consisting of a plurality of the leads 7, the semiconductor chip support lead portion 6B being arranged in a central space portion enclosed by the front ends of the inner portions 7A of the leads 7. A lead frame made up of the leads 7 and the support lead 6 may be manufactured by etching or pressing a flat plate material made of ion (Fe)-nickel (Ni) alloy or copper (Cu) or Cu-based alloy to form a predetermined lead pattern.

The controller chip 30 is mounted on the principal surface (top surface) 20X of the memory chip 20, and the bottom surface of the controller chip 30 opposite the principal surface 30X is bonded to the principal surface 20X of the memory chip 20 with an adhesive 5 to form a semiconductor chip stacked structure. The principal surface 20X of the memory chip 20 of the semiconductor chip stacked structure is securely bonded with the semiconductor chip support lead portion 6B to support the semiconductor chip stacked structure. The top surface of the semiconductor chip support lead portion 6B is lower than the peak of the wires 8.

The resin sealing body 9 is formed square in plan view. In the embodiment 1, for example, it is shaped rectangular. Along the four sides of the resin sealing body 9 are arranged a plurality of outer portions 7B of the leads. The outer portions 7B of the leads are shaped like a gull wing for surface mounting.

The semiconductor package 10 can be reduced in thickness because there are no tabs between the principal surface 30X of the controller chip 30 and the principal surface (top surface) 20X of the memory chip 20. By securely bonding the semiconductor chip support lead portion 6B to the principal surface 20X of the memory chip 20, the thickness of the support lead 6 can be canceled by the loop height of the wires 8. Thus, the support lead 6 has no adverse effect on the thickness of the resin sealing body 9. As a result, it is possible to reduce the thickness of the semiconductor package 10 having a plurality of chips arranged in layers and to construct the package in the form of the TSOP.

In this embodiment, the area of the memory chip 20 is larger than the area of the controller chip 30. In such a case, because the chip with a larger area has a weaker bending strength, it is advised to make the chip with a larger area thicker than the other rather than setting the thicknesses of the two chips equal.

To construct the above-described stack type MCP in the form of TSOP, it is necessary to distribute a total number of electrode pads of a plurality of chips among different directions according to the lead number ratio among the four sides in order to avoid crossing or nearing of the wires when the electrode pads 4 of each chip are connected by the wires 8 to the inner portions 7A of the leads 7 arranged at the four sides. In the example shown in FIG. 2, the arrangement density of the electrode pads at one side of the controller chip 30 is made coarser than those at other three sides and the electrode pads of the memory chip 20 are collectively arranged at one side corresponding to that coarse density side of the controller chip 30. Combining these two chips makes the overall ratio in the number of electrode pads among the four sides almost equal to the lead number ratio, thus eliminating the crossing of the connection wires.

Figure 6:
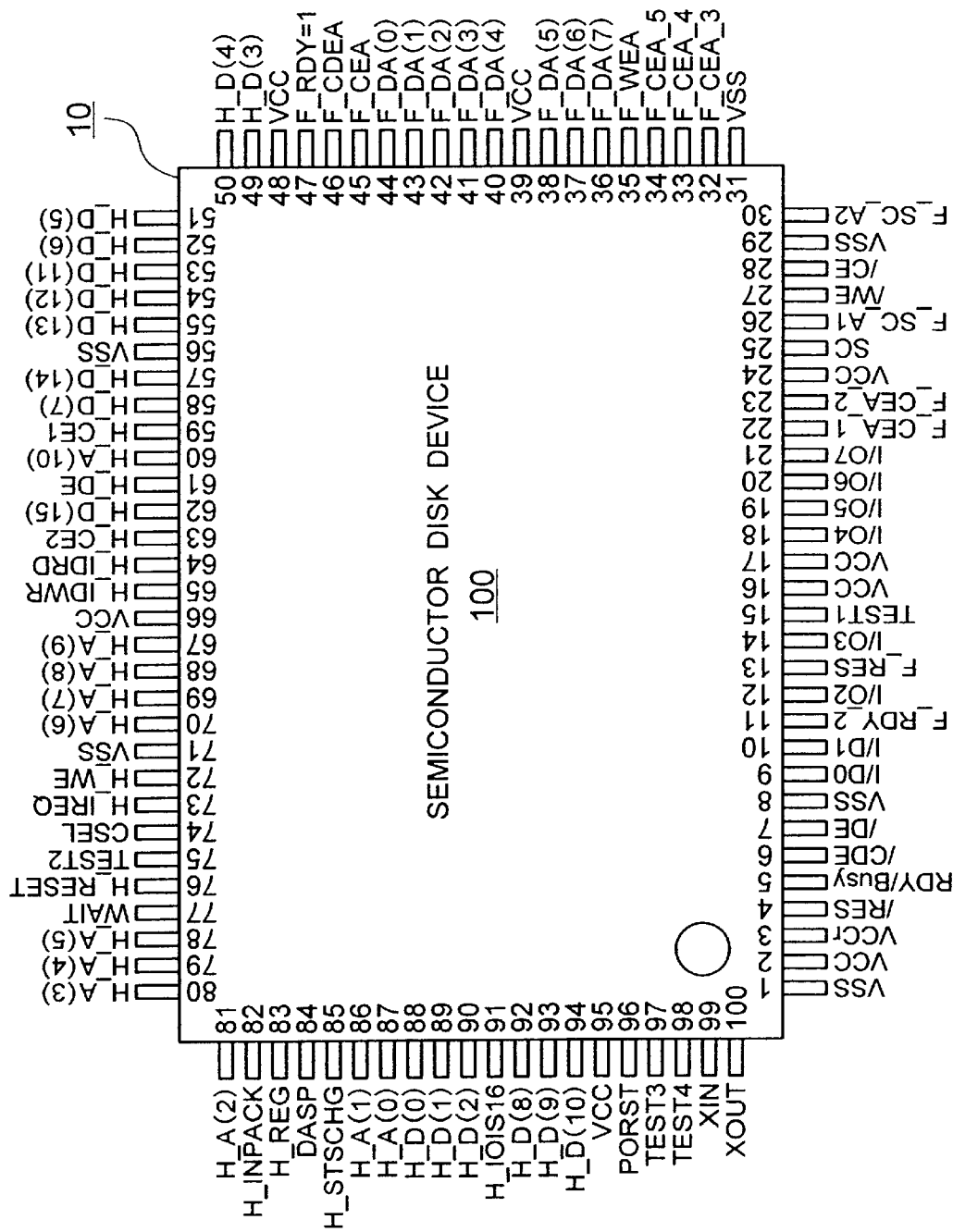
FIG. 6 is an example arrangement of signals allocated to the external terminals of the semiconductor package of the semiconductor disk device according to an embodiment of the invention.

FIG. 6 shows an example arrangement of signals for those external terminals (outer portions 7B of the leads) of the semiconductor package 10 of FIG. 2 which are wire-bonded as described above, with terminal names indicated. For example, a VCC terminal is a controller power potential terminal with 3.3 volts (V) or 5 volts (V) for example. A VCCf terminal is a memory power potential terminal with 3.3 volts (V) for instance. A VSS terminal is a reference potential terminal fixed at a reference potential (0 V for example). I/O0 to I/O7 terminals are connected to an electrode pad 21 of the memory chip 20 to input and output an address/data/command to and from the memory. F_DA(0) to F_DA(7) terminals are connected to an electrode pad 33 of the controller chip 30 to input and output an address/data/command to and from the memory. F_CEA_1 to F_CEA_5 terminals are used as follows. When the controller selects the memory 20 in the package, it selects the F_CEA_1 terminal to output a chip enable signal 1; and when the controller selects the external expansion memory 50, it selects the F_CEA_2 to F_CEA_5 terminals to output chip enable signals 2–5 to the expansion memory. F_OEA terminal is set by the controller when reading data from the memory. F_RDY_1 and F_RDY_2 terminals are set by the controller to perform write and erase operations on the memory. F_WEA terminal is set by the controller to output a memory write enable signal. F_SC_A1 and F_SC_A2 terminals are set with a serial clock by the controller. F_CDEA terminal is set by the controller to control a multiplex bus when writing into the memory. F_RES terminal is set with a RESET signal by the controller. Table 1 shows functions assigned to external terminals.

TABLE 1

| Terminal # | name | Function | Terminal # | name | Function |
|---|---|---|---|---|---|
| 1 | Vss | Ground | 51 | H_D(5) | Data 5 |
| 2 | Vcc | Power supply | 52 | H_D(6) | Data 6 |
| 3 | Vccf | Power supply (flash) | 53 | H_D(11) | Data 11 |
| 4 | /RES | Reset | 54 | H_D(12) | Data 12 |
| 5 | RDY//Busy | Ready/busy | 55 | H_D(13) | Data 13 |
| 6 | /CDE | Command data enable | 56 | Vss | Ground |
| 7 | /OE | Output enable | 57 | H_D(14) | Data 14 |
| 8 | Vss | Ground | 58 | H_D(7) | Data 7 |
| 9 | I/O0 | Input/output 0 | 59 | H_CE1 | Chip enable 1 |
| 10 | I/O1 | Input/output 1 | 60 | H_A(10) | Address 10 |
| 11 | F_RDY_2 | Ready (for bank 2) | 61 | H_OE | output enable |
| 12 | I/O2 | Input/output 2 | 62 | H_D(15) | Data 15 |
| 13 | F_RES | Reset | 63 | H_CE2 | Chip enable 2 |
| 14 | I/O3 | Input/output 3 | 64 | H_IORD | Read data control |
| 15 | TEST1 | Diagnostic mode selection 1 | 65 | H_IOWR | Write data control |
| 16 | Vcc | Power supply | 66 | Vcc | Power supply |
| 17 | Vccf | Power supply (flash) | 67 | H_A(9) | Address 9 |
| 18 | I/O4 | Input/output 4 | 68 | H_A(8) | Address 8 |
| 19 | I/O5 | Input/output 5 | 69 | H_A(7) | Address 7 |
| 20 | I/O6 | Input/output 6 | 70 | H_A(6) | Address 6 |
| 21 | I/O7 | Input/output 7 | 71 | Vss | Ground |
| 22 | F_CEA_1 | Chip enable 1 | 72 | H_WE | Write enable |
| 23 | F_CEA_2 | Chip enable 2 | 73 | H_IREQ | Interrupt request |
| 24 | Vcc | Power supply | 74 | CSEL | Card select |
| 25 | SC | Serial clock input 1 | 75 | TEST2 | Diagnostic mode selection 2 |

TABLE 1-continued

| Terminal # | name | Function | Terminal # | name | Function |
|---|---|---|---|---|---|
| 26 | F_SC_A1 | Serial clock output 1 | 76 | H_RESET | Reset |
| 27 | /WE | Write enable | 77 | WAIT | Wait |
| 28 | /CE | Chip enable | 78 | H_A(5) | Address 5 |
| 29 | Vss | Ground | 79 | H_A(4) | Address 4 |
| 30 | F_SC_A2 | Serial clock output 2 | 80 | H_A(3) | Address 3 |
| 31 | Vss | Ground | 81 | H_A(2) | Address 2 |
| 32 | F_CEA_3 | Chip enable 3 | 82 | H_INPACK | Input acknowledge |
| 33 | F_CEA_4 | Chip enable 4 | 83 | H_REG | Register |
| 34 | F_CEA_5 | Chip enable 5 | 84 | DASP | Handshake control |
| 35 | F_WEA | Write enable | 85 | H_STSCHG | Status signal |
| 36 | F_DA(7) | Data 7 | 86 | H_A(1) | Address 1 |
| 37 | F_DA(6) | Data 6 | 87 | H_A(0) | Address 0 |
| 38 | F_DA(5) | Data 5 | 88 | H_D(0) | Data 0 |
| 39 | Vcc | Power supply | 89 | H_D(1) | Data 1 |
| 40 | F_DA(4) | Data 4 | 90 | H_D(2) | Data 2 |
| 41 | F_DA(3) | Data 3 | 91 | H_IOIS16 | 16-bit assert signal |
| 42 | F_DA(2) | Data 2 | 92 | H_D(8) | Data 8 |
| 43 | F_DA(1) | Data 1 | 93 | H_D(9) | Data 9 |
| 44 | F_DA(0) | Data 0 | 94 | H_D(10) | Data 10 |
| 45 | F_OEA | Output enable | 95 | Vcc | Power supply |
| 46 | F_CDEA | Command data enable | 96 | PORST | Port |
| 47 | F_RDY_1 | Ready signal 1 | 97 | TEST3 | Diagnostic mode selection 3 |
| 48 | Vcc | Power supply | 98 | TEST4 | Diagnostic mode selection 4 |
| 49 | H_D(3) | Data 3 | 99 | XIN | Quartz oscillation (IN) |
| 50 | H_D(4) | Data 4 | 100 | XOUT | Quartz oscillation (OUT) |

Figure 7:
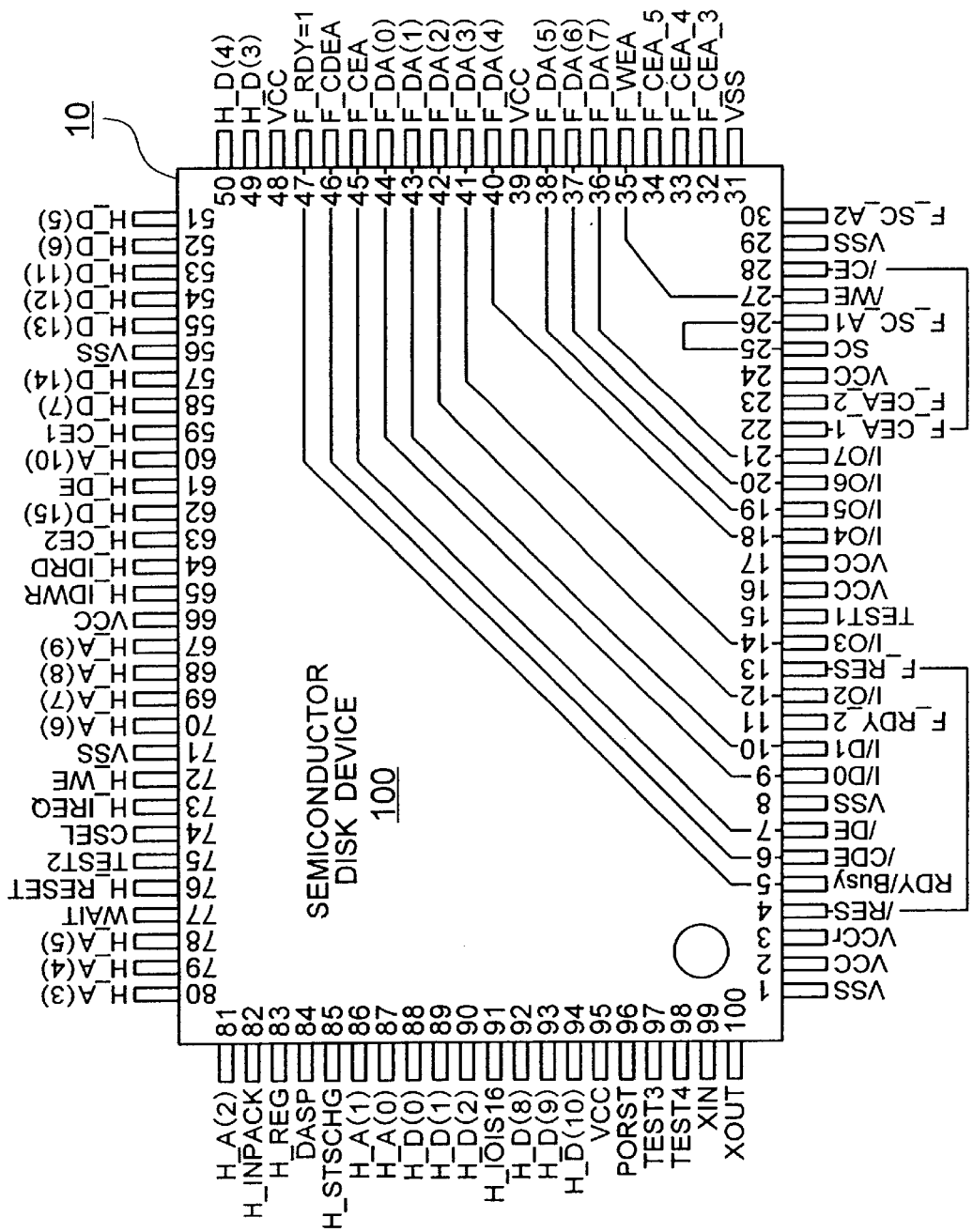
FIG. 7 is an example of connections when the semiconductor disk device according to an embodiment of this invention is mounte d on a board.

FIG. 7 shows example combinations of external terminals that the user is required to short-circuit wiht wires on the board (by connecting two points in the circuit at different potentials using a conductor with a very low resistance) and an example of wiring on the board when the semiconductor package 10 of the embodiment 1 having signals assigned to its external terminals as shown in FIG. 6 is mounted on the board. For example, the F_DA(0) terminal of pin number 44 internally connected to the controller and the 1/O0 terminal of pin number 9 internally connected to the memory are externally connected together. The F_RDY_1 terminal of pin number 47 internally connected to the controller and the RDY/Busy terminal of pin number 5 internally connected to the memory are externally connected together. By externally connecting other terminals according to the combinations shown in FIG. 7, the semiconductor device 100 of this invention is made to function as a semiconductor disk device. If the external connecting wires on the board are arranged as shown in FIG. 7 without any crossing, short-circuit connections can be made on a single wiring layer on the board. This arrangement can suppress an increase in the number of wiring layers on the board and minimize the degree to which these wires are hindrance to other wires. The signal allocation to the external terminals arranged in such a manner as to minimize the crossing of the wires on the board as described above is considered necessary.

Figure 8:
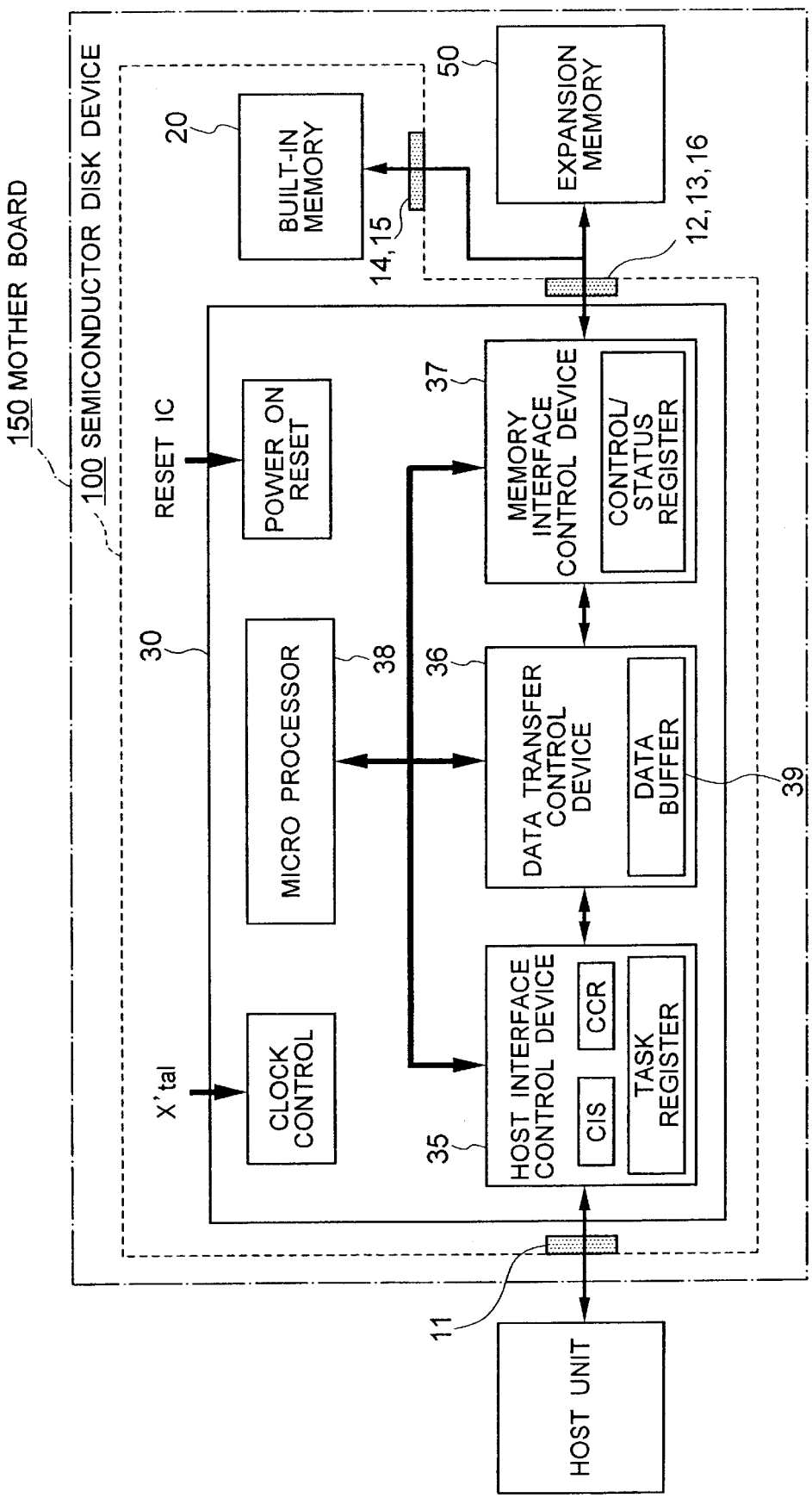
FIG. 8 is a block diagram of a controller provided in the semiconductor disk device according to embodiment 1 of this invention.
Figure 9:
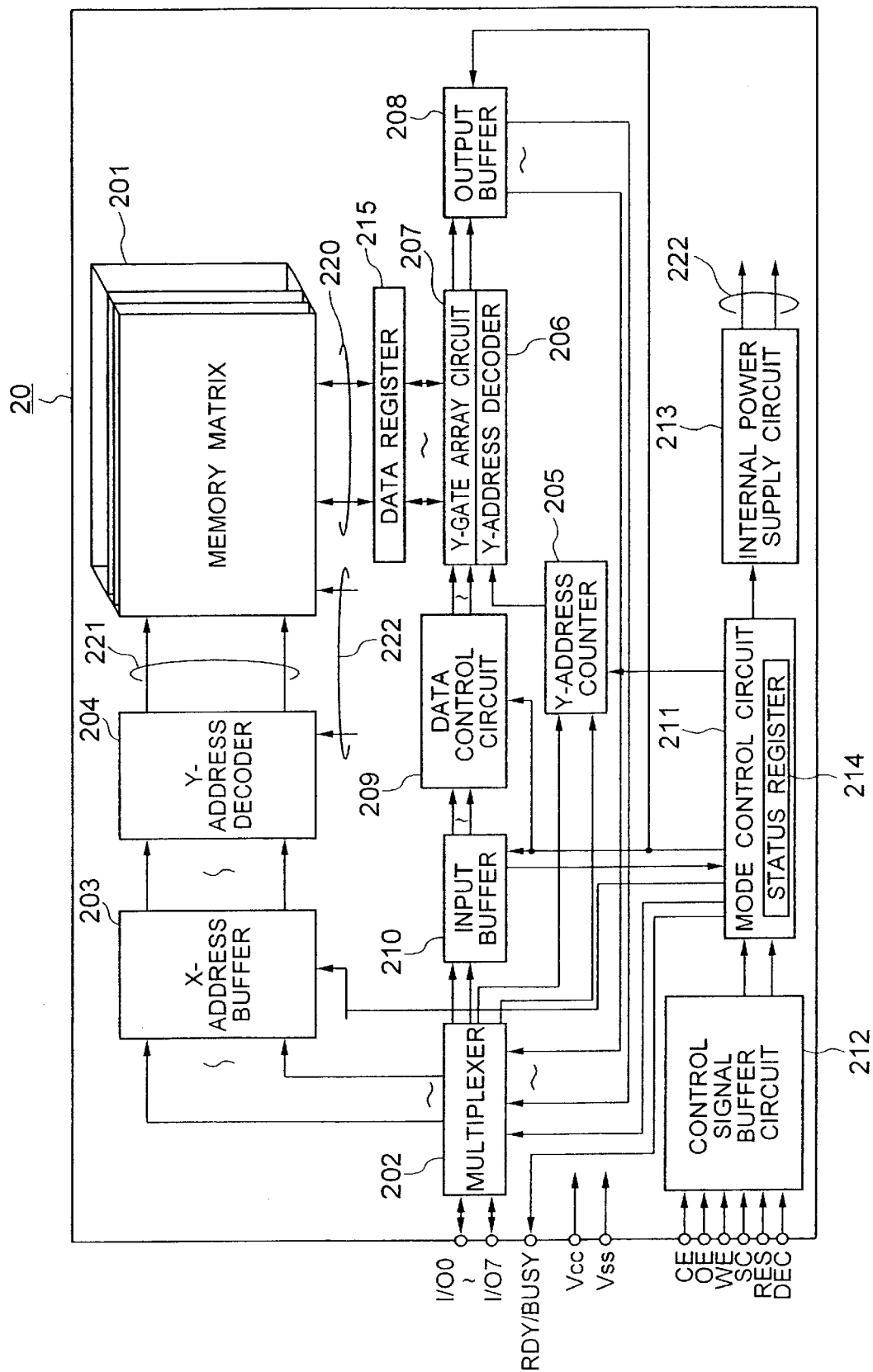
FIG. 9 is a block diagram of a flash memory provided in the semiconductor disk device according to embodiment 1 of this invention.

FIG. 8 shows an example block diagram of the controller 30 and FIG. 9 shows an example block diagram of the flash memory 20.

The function of the controller shown in FIG. 8 has an interface that conforms to the specifications defined by PCMCIA (Personal Computer Memory Card International Association) and supports all operation modes including a memory card mode, an I/O card mode and an IDE (Integrated Device Electronics) compatible mode. The controller allows the host unit to access the memory according to a method similar to that of the memory card or I/O card (PC card) or through an interface similar to that of the conventional IDE compatible hard disk drive. This controller, as shown in the figure, comprises a 16-bit CPU as a core processor 38, a host interface control unit 35, a data transfer control unit 36, and a memory interface control unit 37.

The host interface control unit 35 has a register for recording various property information on hardware resource or CIS (Card Information Structure) referenced by the host unit in the PC card access mode and a CCR (Card Configuration Register) storing various card standard specifications. When the host unit accesses the semiconductor disk device 100, the host unit sends a command compatible, for example, with the ATA specification (AT Attachment: the specification standardized by ANSI (American National Standard Institute) based on the IDE, one of hard disk drive interfaces) via a host unit connection external terminal (host interface) 11 and references the CIS to establish the connection and then execute the reading and writing of data. The host interface control unit 35 receives the command, decodes it and temporarily stores in a task register an address representing an access start position, a data length and write data supplied. When the data is to be read out, the host interface control unit 35 temporarily accumulates the data read from the memory in the task register and sends the data to the host unit in response to an ATA-compatible command.

The memory interface control unit 37 forms an interface according to the unique characteristic of the memory built into the semiconductor disk device 100 or of the expansion memory. By using a memory command dedicated to the memory, the memory interface control unit 37 performs the memory access control. When the memory specification changes, only the specification of the memory interface control unit 37 needs to be changed. The memory interface control unit 37 checks whether the address accessed by the host unit corresponds to the built-in (flash) memory or the external expansion (flash) memory, and generates a chip enable signal for the associated (flash) memory. At the same time, the ATA-compatible command from the host unit is converted into a memory command which is then fed to the associated (flash) memory via the external terminal 12 (memory interface). Upon receiving the chip enable signal, the (flash) memory enters an active state and its operation mode for access control is set by the memory command from the memory interface control unit 37.

<Overall Configuration of Flash Memory>

FIG. 9 shows an overall configuration of the flash memory 20 to be access-controlled by the memory interface control unit 37.

Figure 20:
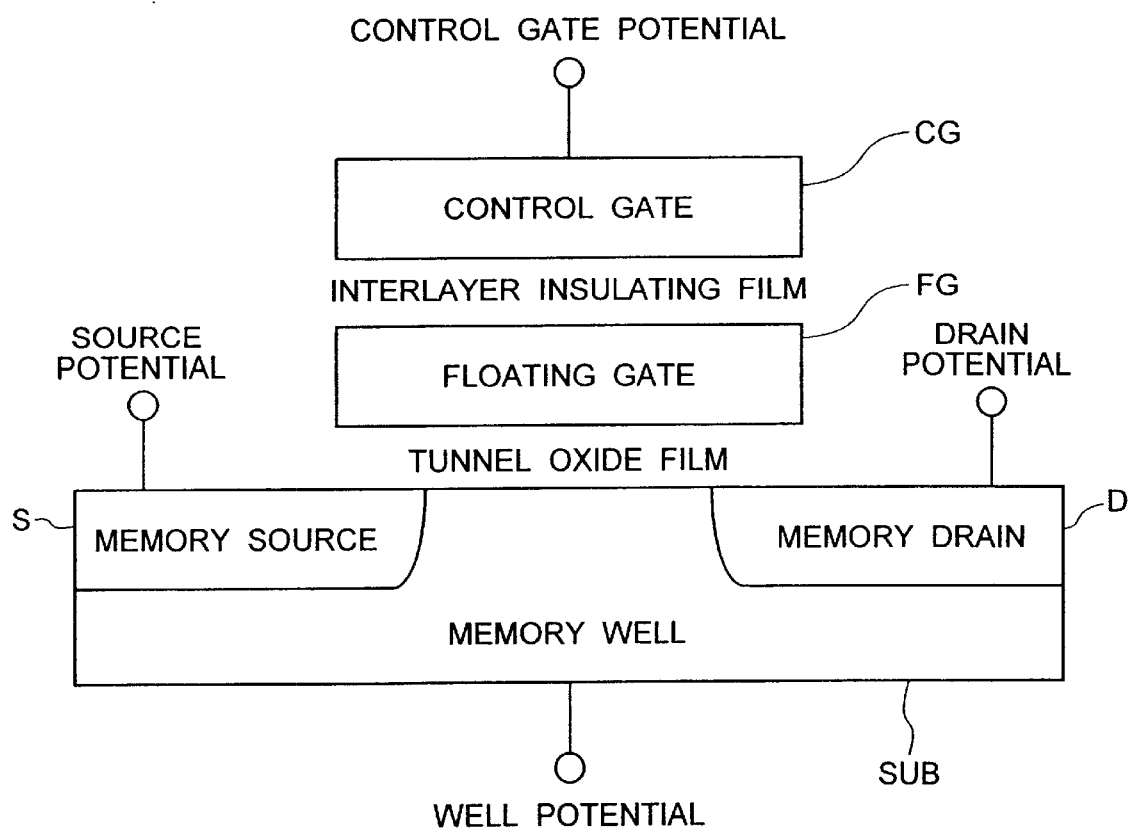
FIG. 20 is an example cross section of a memory cell in the flash memory.

The memory matrix (memory array) 201 has a large number of electrically erasable and programmable, nonvolatile memory cell transistors arranged in arrays. The memory cell transistors each have, as shown in FIG. 20, a source S and a drain D formed in a semiconductor substrate or a memory well SUB, a floating gate FG formed in a channel region with a tunnel oxide layer interposed between it and the memory well, and a control gate CG formed over the floating gate with an interlayer insulating layer therebetween. The control gate CG is connected to a word line 221, the drain D to a bit line 220, and the source S to a source line not shown.

The external input/output terminals I/O0–I/O7 serve as address input terminals, data input terminals, data output terminals and command input terminals. The X-address signal (sector address signal) input from the external input/output terminals I/O0–I/O7 is supplied through a multiplexer 202 to an X-address buffer 203. An X-address decoder 204 decodes an internal complementary address signal output from the X-address buffer 203 to drive the word line 221.

(At one end of the bit lines 220 a sense latch circuit not shown is provided; and at the other end a data latch circuit not shown is provided.) The bit line 220 is selected by a Y-gate array circuit 207 based on a selection signal output from a Y-address decoder 206. A Y-address signal input from the external input/output terminals I/O0–I/O7 is preset in a Y-address counter 205 where the address signal is incremented from a preset value as a starting point and is given to the Y-address decoder 206. The bit line 220 selected by the Y-gate array circuit 207 is connected to an input terminal of an output buffer 208 during the data output operation and, during the data input operation, to an output terminal of an input buffer 210 through a data control circuit 209. The bit lines 220 are provided with a data register 215 that holds one sector of write data. The write data is taken in 8 bits at a time from the external input/output terminals I/O0–I/O7 and stored in the data register 215. When one sector of write data is stored in the data register 215, the write data is written into a sector address specified by the X-address.

The connections between the output buffer 208, the input buffer 210 and the external input/output terminals I/O0–I/O7 are controlled by the multiplexer 202. A command supplied from the external input/output terminals I/O0–I/O7 is given to a mode control circuit 211 through the multiplexer 202 and the input buffer 210. The data control circuit 209 processes logic data representing the control of the mode control circuit 211 as well as the data supplied from the external input/output terminals I/O0–I/O7 so that they can be fed into the memory array 201.

A control signal buffer circuit 212 is supplied with access control signals, i.e., a chip enable signal CE, an output enable signal OE, a write enable signal WE, a serial clock signal SC, a reset signal RES, and a command enable signal CDE. The mode control circuit 211 controls an external signal interface function according these access control signals and also controls an internal operation according to the command code. When inputting a command or data from the external input/output terminals I/O0–I/O7, the command enable signal CDE is asserted. If a command is input, the write enable signal WE is also asserted; and if data is input, the write enable signal WE is negated. If an address is input, the command enable signal CDE is negated and the write enable signal WE is asserted. Thus, the mode control circuit 211 can distinguish between the command, data and address that are input from the external input/output terminals I/O0–I/O7 through multiplexer. The mode control circuit 211 can notify its state to the external circuit by asserting a Ready/Busy signal RDY/Busy during the erase or write operation.

An internal power supply circuit 213 generates a variety of operation power supplies 222 for writing, erase verification and reading and feeds them to the X-address decoder 204 and memory cell array 201.

The mode control circuit 211 performs an overall control on the flash memory 20 according to the memory command. The operation of the flash memory 20 is determined basically by the memory command. The memory commands assigned to the flash memory 20, as shown in Table 2, include such commands as read, erase, additional write, rewrite, erase verify, reset and status register read/clear.

TABLE 2

| Command | Bus cycles | First bus cycle Operation mode | First bus cycle Data in | Second bus cycle Operation mode | Second bus cycle Data in/out | Third bus cycle Operation mode | Third bus cycle Data in | Fourth bus cycle Operation mode | Fourth bus cycle Data in |
|---|---|---|---|---|---|---|---|---|---|
| Read | 3 | Write | 00H | Write | SA(1) | Write | SA(2) | | |
| Erase (Single sector) | 4 | Write | 20H | Write | SA(1) | Write | SA(2) | Write | B0H |
| Erase (Block) | 4 | Write | 7FH | Write | BA(1) | Write | BA(2) | Write | B0H |
| Additional write | 4 | Write | 10H | Write | SA(1) | Write | SA(2) | Write | 40H |
| Rewrite (Pre-erase) | 4 | Write | 1FH | Write | SA(1) | Write | SA(2) | Write | 40H |
| Additional write (Control bytes) | 4 | Write | 0FH | Write | SA(1) | Write | SA(2) | Write | 40H |
| Erase verify | 4 | Write | A0H | Write | SA(1) | Write | SA(2) | Write | A0H |
| Reset | 1 | Write | FFH | | | | | | |
| Status register Read | 2 | Write | 70H | Read | SRD | | | | |
| Status register Clear | 1 | Write | 50H | | | | | | |

SA(1) = Sector address (A0 to A7),
SA(2) = Sector address (A8 to A13),
BA(1) = Block address (A3 to A7),
BA(2) = Block address (A8 to A13) [Entering A0 to A2 is not required].
SRD = Status register data The flash memory 20 has a status register 214 to indicate its internal state. The content of the status register 214 can be read out from the external input/output terminals I/O0–I/O7 by asserting the signal OE. For example, according to the additional write command, the mode control circuit 211 performs the data write control and verifies the result of the write operation. When the write operation results in an error, the write operation is attempted a predetermined number of times. If the error still persists, a write abnormal flag is set in the status register 214. The controller can check if the data write operation is normally ended by issuing a status register read command after it has issued an additional write command.

Figure 10:
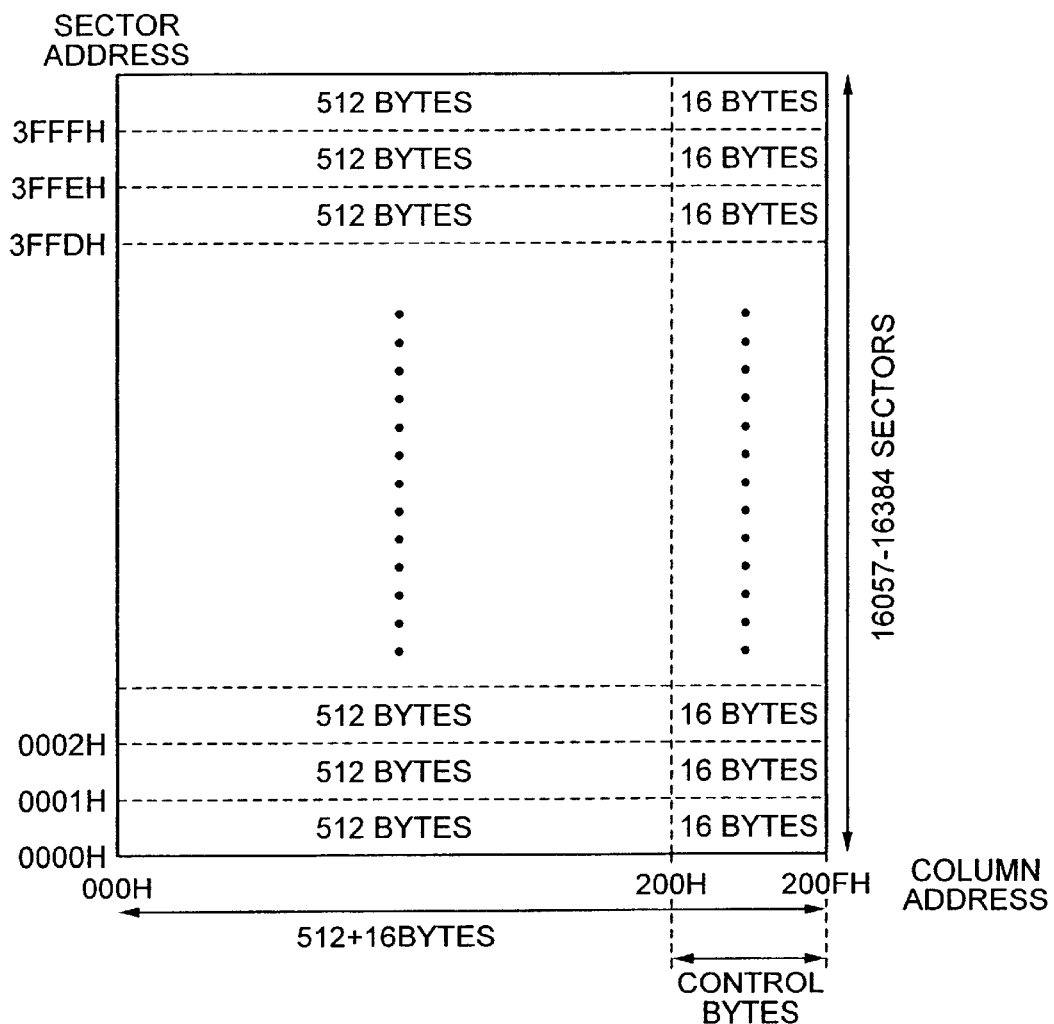
FIG. 10 is a memory map of a 64-Mb flash memory provided in the semiconductor disk device according to embodiment 1 of this invention.

The memory interface control unit 37 in FIG. 8 has a definition of correspondence relation between disk addresses representing access start positions specified by the host unit (track number, sector number, etc.) and memory addresses of the (flash) memory (block number, sector number, chip number, etc.) and references it to convert a disk address specified by the host unit into a corresponding memory address of the (flash) memory. For example, FIG. 10 shows a memory map of a 64-Mbit flash memory, with each sector comprising 512 data bytes and 16 control bytes. The memory interface control unit 37 controls a sequential read/write access to this memory one sector at a time. During the data write mode, the memory interface control unit 37 extracts the write data accumulated in a data buffer 39 512 bytes at a time and transfers them to the flash memory 8 bits at a time through the external terminal 12 and memory bus 301. During the read mode, the memory interface control unit 37 transfers read data 8 bits at a time from the flash memory into the data buffer 39. The internal state read from the status register 214 of the flash memory 20 is written into the Control/status register. The read data that was normally read and stored in the data buffer 39 is transferred by the host interface control unit 35 to the host unit through the host interface 11. At the same time, processing to check that the data has been normally written is also performed by reading the data written into the flash memory 20 in the write mode and checking it against the write data. For the read/write control on the flash memory 20, the memory commands (Table 2) and the access control signals are issued. The memory interface control unit 37 multiplexes the memory command, address and data and transfers them through the memory interface 12.

The control bytes, redundant bytes added to each of the sectors shown in FIG. 10, are written with information including an error correcting code (ECC) for the data region of the associated sector, an identification code representing writable region/replacement region/bad region, a logic address, and a number of rewriting operations. Each sector is checked at an initial stage or at any arbitrary time to see whether the storage operation can be made or not. The sectors that failed the check are attached with the "bad region" identification code for management. In the flash memory shown in FIG. 10, it is guaranteed that there are at least 16,057 good sectors (sectors that can be used as writable region/replacement region). Memory cells in the data region where a write error has occurred are replaced with the memory cells of control bytes.

The data transfer control unit 36 of FIG. 8 stores the write data sent from the host unit into the data buffer 39, then generates an error correcting code ECC based on the BCH code (Bose-Chaudhuri-Hocquenghem code) theory and writes it into the control bytes. The memory interface control unit 37 writes the write data stored in the data buffer 39 and the error correcting code ECC into the memory. The data transfer control unit 36 stores the read data read out from the memory into the data buffer 39 and, based on the error correcting code ECC in the control bytes that was read out at the same time, performs error correction processing on the read data. The error correcting processing corrects up to two bits of errors in the 512 bytes of data per sector, for example.

When a security is required of the information to be stored in the memory, a variety of encryption processing is executed. The data transfer control unit 36 encrypts the write data held in the data buffer 39 and decrypts the read data. Possible encryptions for use include "MULTI2" and American DES (Data Encryption Standard) in the "common key encryptions" system and RSA encryption in the "public key encryptions" system. It is also conceivable to encrypt the read data to be sent out to the host unit and decrypt the data received from the host unit.

As described above, because the controller chip 30 of FIG. 8 is divided into function blocks, it is possible to deal with a change in the host unit interface specification by changing the function of only the host interface control unit 35. When the memory specification is changed, this can be dealt with similarly by changing the function of only the memory interface control unit 37.

Figure 11:
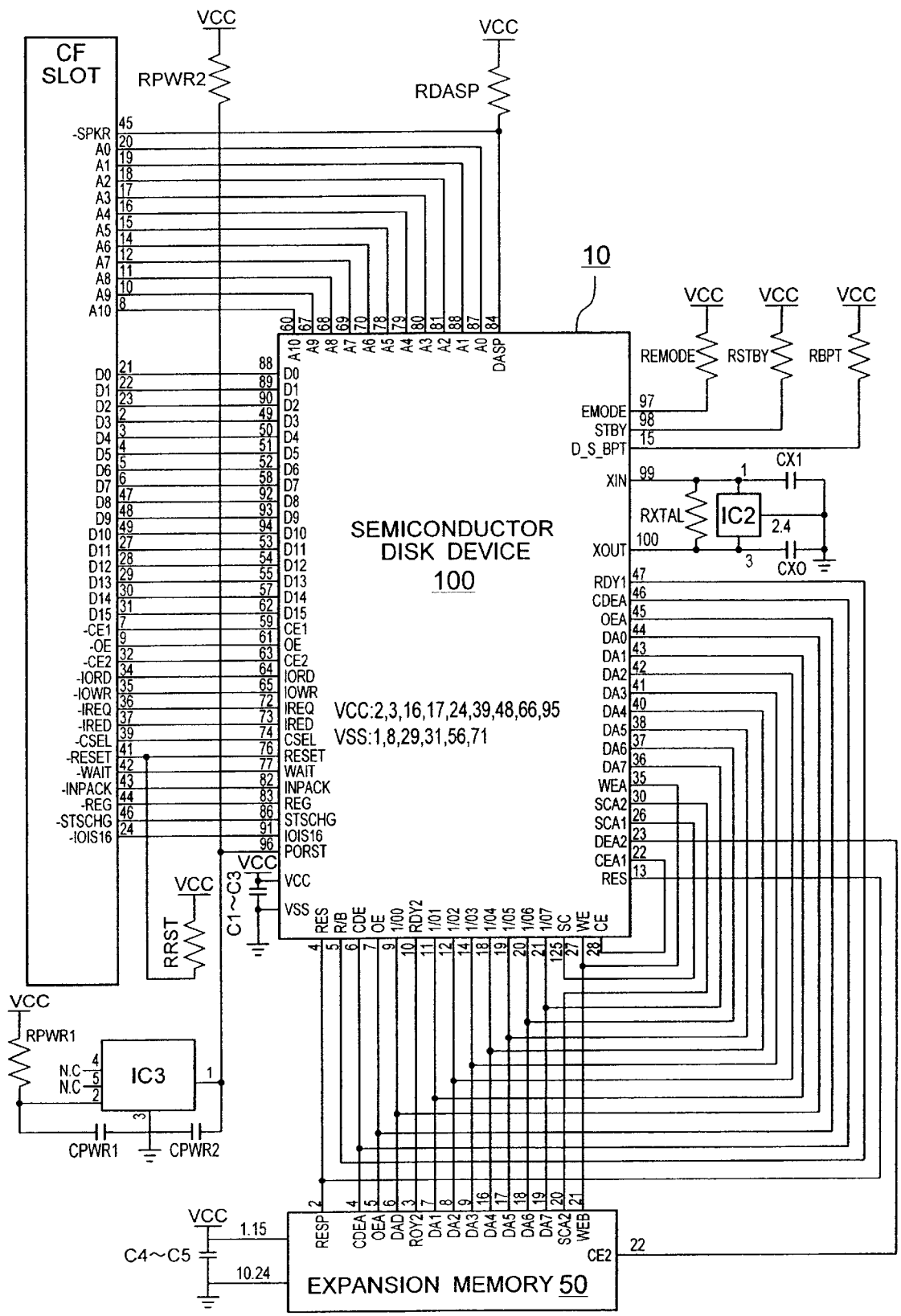
FIG. 11 is an example of connecting an expansion memory to the semiconductor disk device according to embodiment 1 of this invention.

FIG. 11 shows an example of connections for expanding the (flash) memory in the embodiment where the semiconductor disk device 100 of this invention shown in FIG. 7 is mounted on the board. The I/O0–I/O7 terminals of the expansion (flash) memory 50 are connected, outside the semiconductor disk device 100 (on the board), to the F_DA(0)—F_DA(7) terminals of the controller, as with the I/O0–I/O7 terminals of the built-in (flash) memory. The built-in (flash) memory and the expansion (flash) memory are connected on the memory bus in the same hierarchy (a form of connection that supplies the address, data and various control signals commonly). As to other access control signals, the following connections are made. For the chip enable signal CE, the output terminals F_CEA_1, F_CEA_2 of the controller are connected to the built-in (flash) memory and the expansion (flash) memory respectively. Similarly, for the serial clock signal SC, the F_SC_A1, F_SC_A2 terminals of the controller are connected to the memories respectively. For the ready/busy signal RDY/Busy, the F_RDY_1, F_RDY_2 terminals of the controller are likewise connected to the memories respectively. For the command enable signal CDE, output enable signal OE and write enable signal WE, the signal terminals of the controller are commonly connected to the signal terminals of the built-in (flash) memory and the expansion (flash) memory.

Thus, the memory expansion terminal for the expansion (flash) memory (external terminal 16 of FIG. 1) generally refers to the external terminals for the chip enable signal CE, serial clock signal SC and ready/busy signal RDY/Busy.

Figure 25:
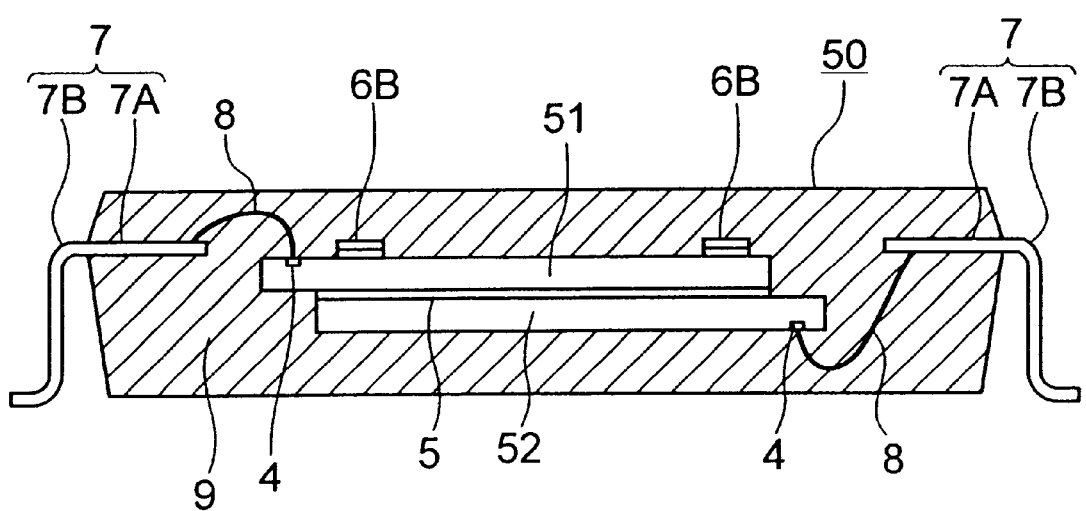
FIG. 25 is an example of a stacked type package of expansion memory.

The expansion (flash) memory 50 is mounted on the board in the form of a package three-dimensionally incorporating a plurality of memory chips, as shown in FIG. 25. As the required memory capacity increases, this mounting configuration is considered a promising one. Semiconductor chips 51, 52 are constructed of, for example, 64-Mbit flash memories EEPROM (Electrically Erasable & Programmable Read Only Memory). The semiconductor chips 51, 52 are securely bonded together with an adhesive layer 5 therebetween and with their back surfaces in contact, and are shifted from each other in a direction perpendicular to the arrangement direction of the electrode pads 4. The semiconductor chips 51, 52 are each supported by the support lead portion 6B, and the electrode pads 4 and leads 7 are each electrically connected through wires 8. These are wholly sealed by the resin sealing body 9.

Where the expansion memory 50 of FIG. 11 has a multichip structure as described above, the component expansion memories 51, 52 are commonly connected to the bus interconnecting the controller chip 30 and the built-in memory 20, except that the access control signals dedicated to the memory chips (chip enable signal CE, serial clock signal SC and ready/busy signal RDY/Busy) are connected individually to each of the expansion memories 51, 52. The semiconductor disk device with an expansion memory mounted on the mother board is constructed in this way.

The semiconductor disk device 100 according to embodiments of the present invention described above incorporates a plurality of different kinds of semiconductor chips in a single package and thus the tests conducted on these chips differ because the chips are of different kinds. It is therefore necessary to conduct different tests on the different semiconductor chips after the package has been assembled. To enhance the precision at which to identify faulty locations requires preventing a leakage current produced by one semiconductor chip from entering the input and output terminals of the other semiconductor chip. As a solution to this requirement, it is conceivable to avoid as much as possible the internal connection between the plural chips in the semiconductor disk device 100 and extract their leads independently of each other to the external terminals of the package. Only the ground Vss may be commonly shared. The chips are each provided with an independent power supply Vcc terminal to enhance the accuracy of the standby current screening test.

The testing of the semiconductor disk device 100 may be efficiently conducted in two steps: one for checking a plurality of memory chips simultaneously by a memory test system and one for checking the controller at high speed by a logic test system. This offers a great advantage of being able to utilize the test environments of the individual semiconductor chips and reduce a turnaround time (TAT) for the semiconductor device development.

(Embodiment 2)

Figure 12:
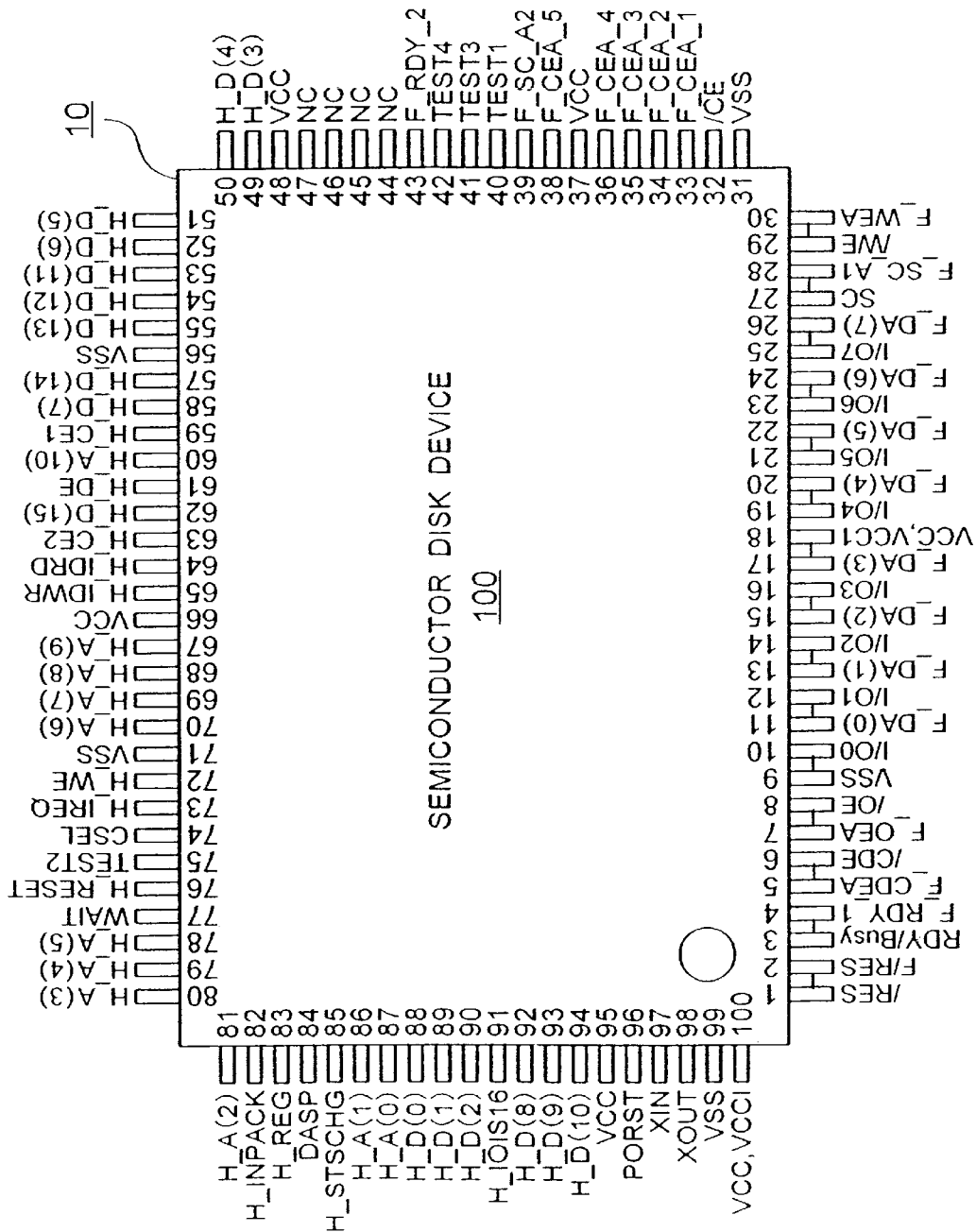
FIG. 12 is an example of signal allocation to the external terminals considering the ease with which to connect a semiconductor disk device on the board according to embodiment 2 of this invention.

FIG. 12 shows an example of external terminal arrangement, different from the one shown in FIG. 6, that considers facilitating the external short-circuiting connections outside the semiconductor disk device 100. What is changed from FIG. 6 is that the terminals required to be externally connected are arranged adjacent to each other to a practically feasible extent to reduce an external connection distance between the external terminals from the controller chip 30 and the external terminals from the memory chip 20.

In the embodiment 1 shown in FIG. 6, the existing controller chip and memory chip are mounted in one package and the electrode pad arrangements of the controller chip and the memory chip are originally determined mainly for their own separate packages. Even when these existing chips are used, the example configuration shown allows the external terminals to be arranged at four sides by connecting the electrode pads to the leads through wires as shown in FIG. 2 if some changes or improvements are made as to the horizontal positional relationship among a plurality of stacked chips, the arrangement of the electrode pads and the wire connection positions. It is also necessary, however, to consider a burden on the part of the user connecting the external terminals through wiring on the board.

The embodiment 2 shown in FIG. 12 can be realized, for example, by designing the arrangement of the electrode pads of the controller to suit the MCP application so that the external terminals of the controller chip and memory chip that are required to be connected can be placed adjacent to each other. If the external terminals to be connected together are placed close to each other, the user can easily make short-circuit connections on the board. Because of various restrictions imposed on the arrangement of the electrode pads on the chip, it is only to a practically feasible extent that the proximate placement of the external terminals to be connected is considered achievable.

(Embodiment 3)

Figure 13:
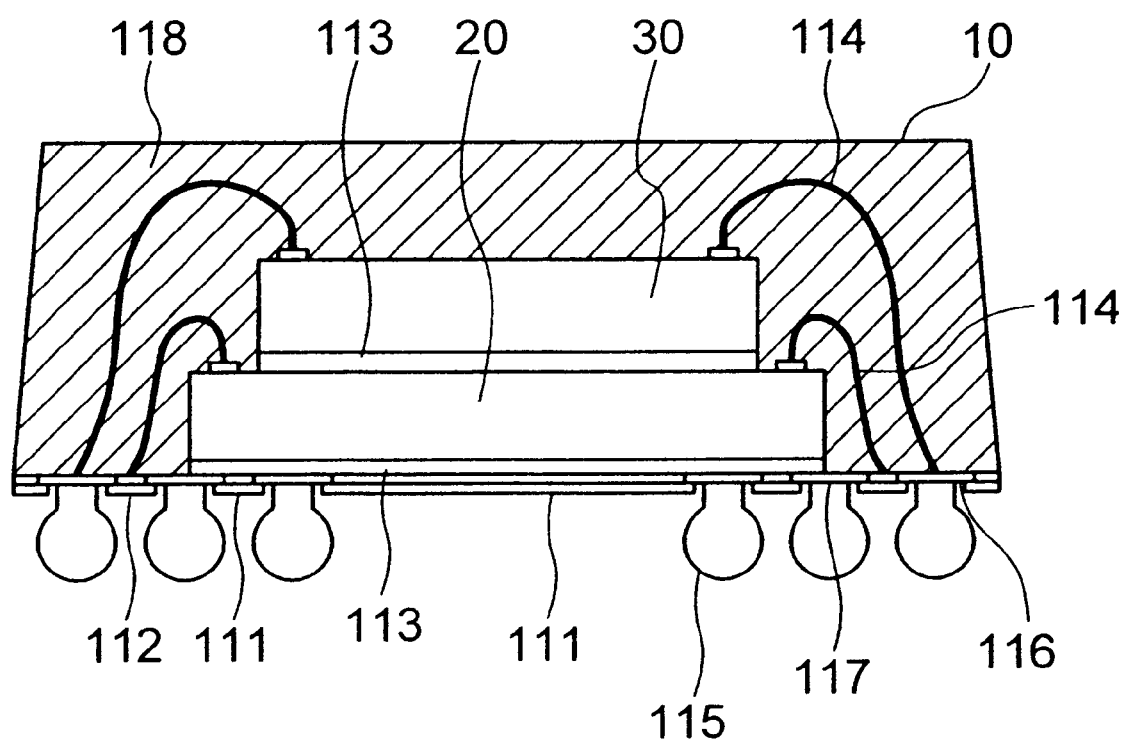
FIG. 13 is a cross section of a stack type CSP embodying this invention.

FIG. 13 shows an example cross section of a stacked CSP implementing the present invention. Like the embodiment 1, this embodiment has the controller chip 30 and the memory chip 20 accommodated in a single package. The electrode pads of each chip are connected to electrode portions of an interconnect layer 112 through wires 114, and external terminals 115 are formed and connected to land portions 117 of the interconnect layer 112 through via holes 116 in an insulating substrate 111. The interconnect layer 112 is formed often in multiple layers rather than in a single layer.

This embodiment, too, as in the embodiment 1, basically does not internally connect the input/output terminals of the controller chip 30 and memory chip 20 for the address, data, command and access control signals but connects them independently to the external terminals 115. Other signals and power supplies are also connected basically independently to the external terminals 115.

Figure 14:
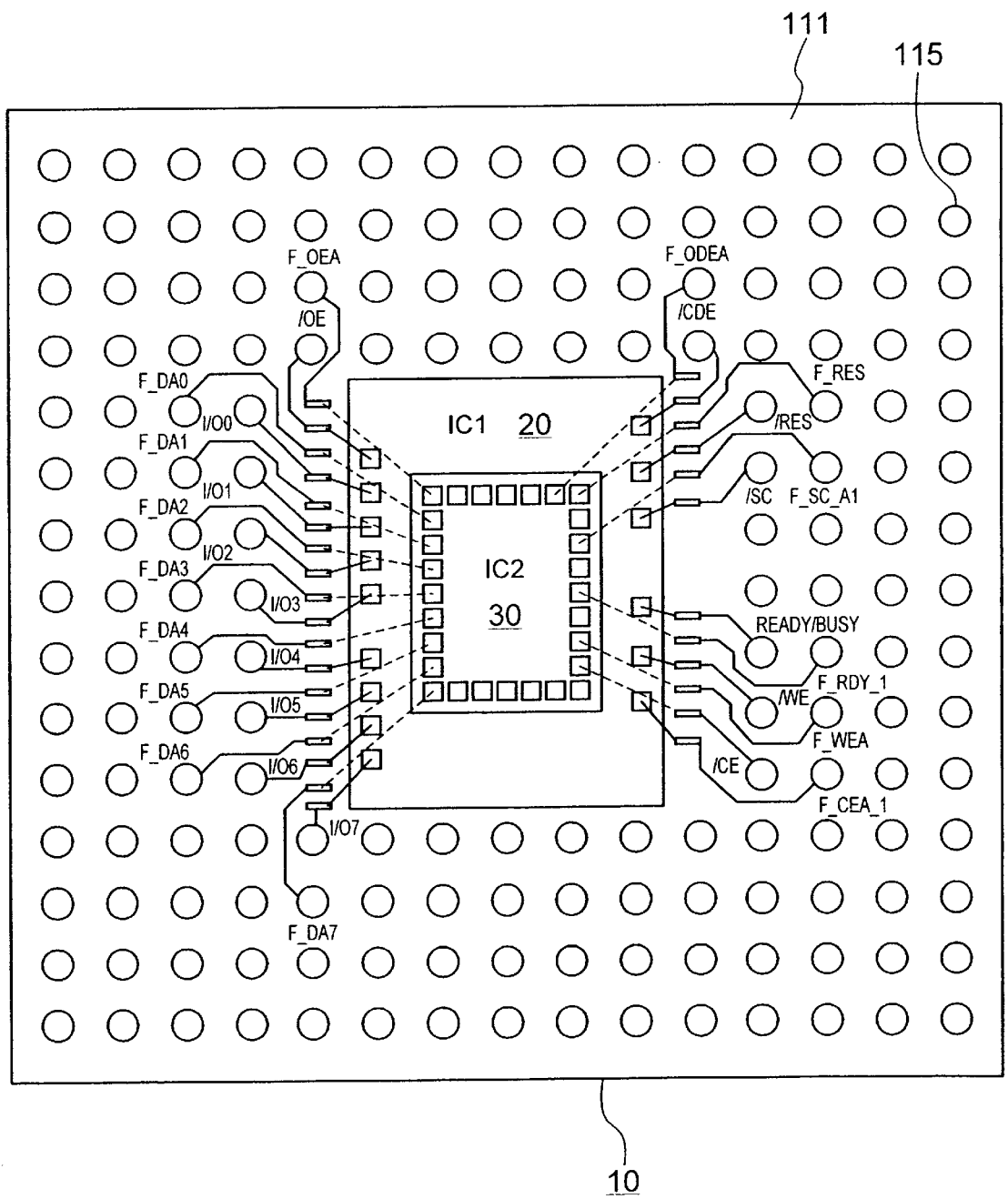
FIG. 14 is an example of connecting signals to the external terminals of the CSP of FIG. 13.

FIG. 14 is a conceptual diagram showing an example of internal connections in the CSP and in the interconnect layer of those signals which are required to be externally connected to the external terminals 115 of the CSP of FIG. 13. Signal names are identical with those shown in FIG. 6. The reason for making connections to the external terminals 115 in a manner shown in FIG. 14 is that when the CSP is mounted on the board, the on-board wiring to the external terminals 115 situated on the inner side of the external terminal array increases in density as the pitch of the external terminals decreases making the on-board wiring more difficult. Hence, the external terminals to be externally interconnected on the board are chosen as practically as possible from among those situated close to each other on the inner side.

Figure 15:
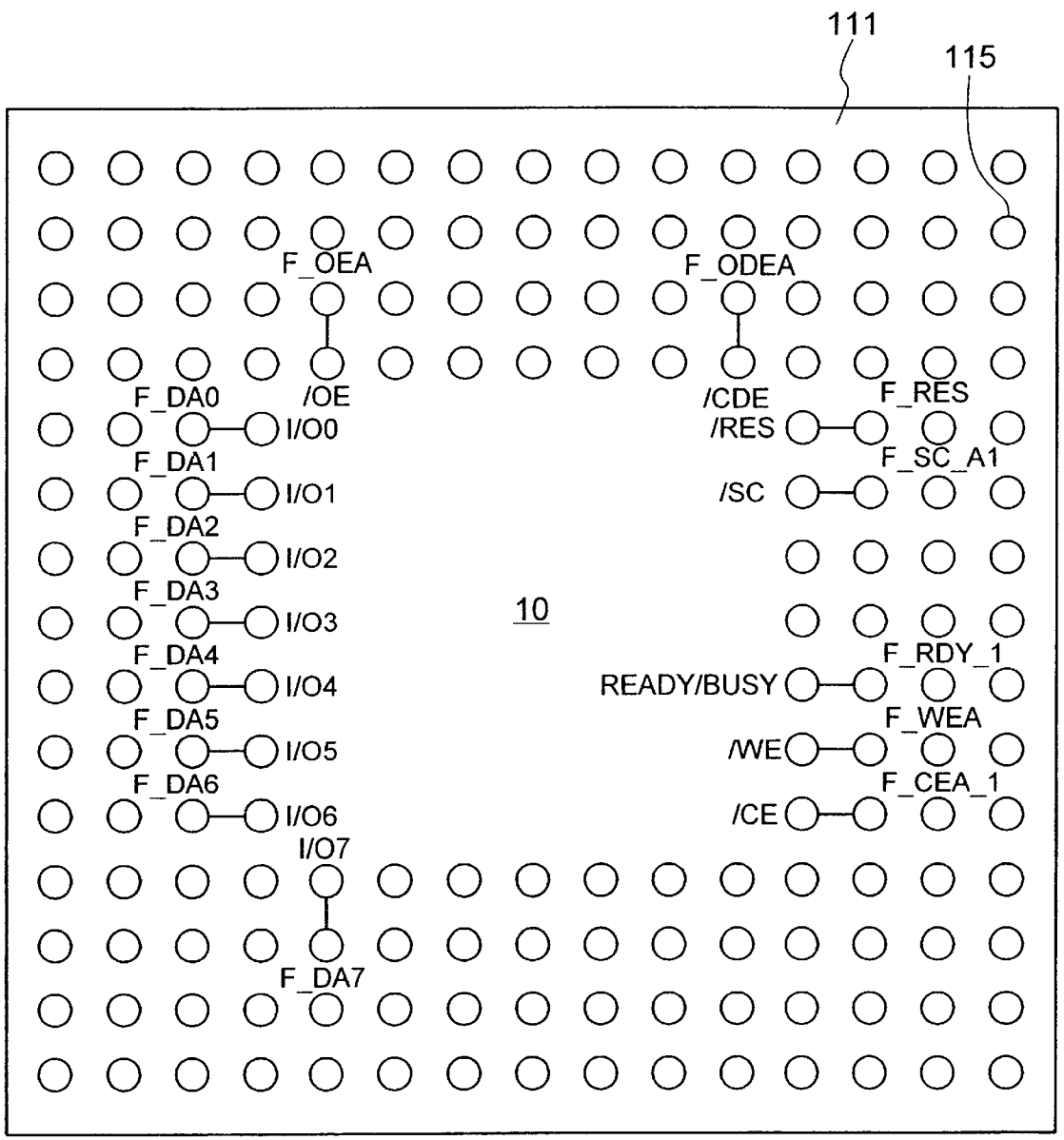
FIG. 15 is an example of connecting the external terminals of the CSP of FIG. 13 on the board.

FIG. 15 shows an example of on-board external connections between those external terminals to which the signal terminals are output as shown in FIG. 14.

(Embodiment 4)

Figure 16A:
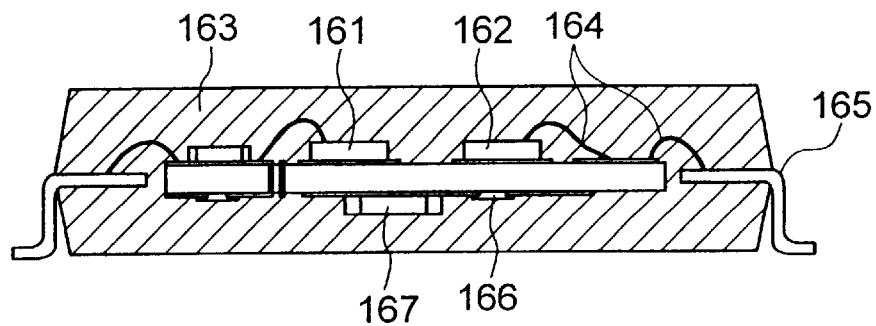
FIG. 16a is an example of a lead frame type MCM embodying this invention.
Figure 16B:
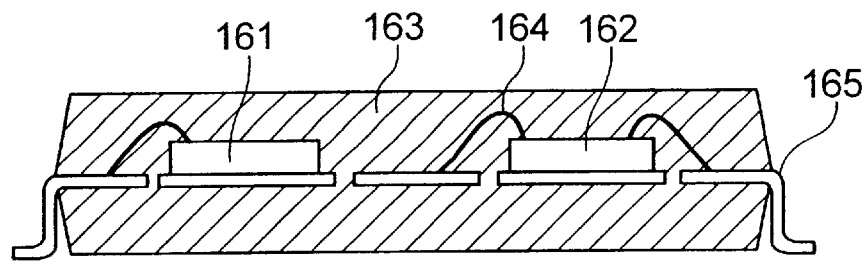
FIG. 16b is another example of a lead frame type MCM embodying this invention.
Figure 16C:
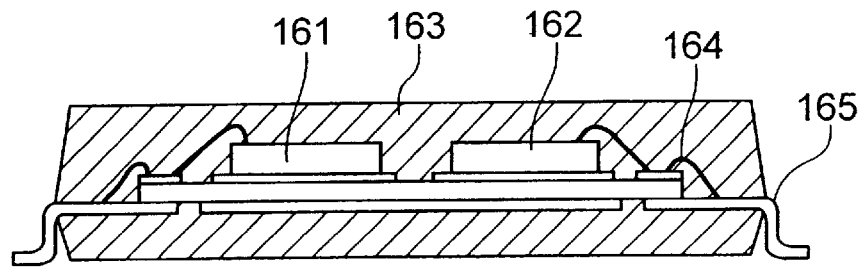
FIG. 16c is still another example of a lead frame type MCM embodying this invention.

Implementing this invention also in the lead frame type MCM (Multi-Chip Module) configuration as shown in FIGS. 16a–16c, i.e., independently connecting the chips to the external terminals without internally connecting them, can make the test environments of the individual chips in the MCM package identical with the test environments originally developed for the individual chips., as described in the embodiment 1. FIG. 16a shows an example of module using a circuit board, FIG. 16b an example of a module using a lead frame, and FIG. 16c an example of a module using a circuit board and a lead frame. Denoted 161 is a first LSI chip, 162 a second LSI chip, 163 resin, 164 wires, 165 lead frames, 166 thick film resistors, and 167 a chip capacitor.

(Embodiment 5)

The technical concept of this invention as exemplified in the embodiment 1 to embodiment 4 discussed above can similarly be applied to any package incorporating a plurality of chips.

For example, if there are demands for increasing the mounting density of "conventionally mounted" chips that are mounted on a mother board or MCM circuit board as shown in FIG. 17 for a predetermined function (they are assumed to be mounted either in the form of a package or as bare chips) and if a large number of such products are expected to be manufactured, then a plurality of chips may be grouped appropriately and incorporated into a single package. A three-dimensional chip mounting configuration is particularly effective in enhancing the mounting density.

When incorporating a plurality of chips into one package, this invention is characterized in that the connections between the chips are not brought into the package as practically as possible and that the terminals of each chip are drawn out of the package and individually connected to external terminals. This arrangement ensures that the environment under which each of the chips mounted in a single package is tested is very close to or identical with the environment under which each chip is tested as it is installed in its own package. This offers a high possibility that the existing test environment can be used as is, thus guaranteeing the test reliability. This also reduces the number of test development processes required to develop a new package, contributing to a reduction in the development cost and development period.

If a part of the connections between a plurality of chips should be accommodated in the package, the test reliability cannot be guaranteed unless some measures are taken to eliminate influences of the in-package chip-to-chip connections. An example case of accommodating a part of the connections between a plurality of chips into the package may be where it is required to shorten the interconnecting wire lengths for faster processing.

The present invention can be applied not only to the chips that are closely related with each other and directly connected on the board (chip A and chip B in FIG. 17 in a closely related group) but also to the chips which, though not directly connected, are deemed to constitute an indispensable combination to realize a certain function (chip D and chip E in a remotely related group). These applications are expected to produce the similar effects.

In a package incorporating a group of the remotely related chips, because the in-package connections of one chip are independent of those of the other chips (power supply or ground may be shared), a failure of one chip does not prevent the other normal chips from remaining operational in the range of their functions.

(Embodiment 6)

Figure 18:
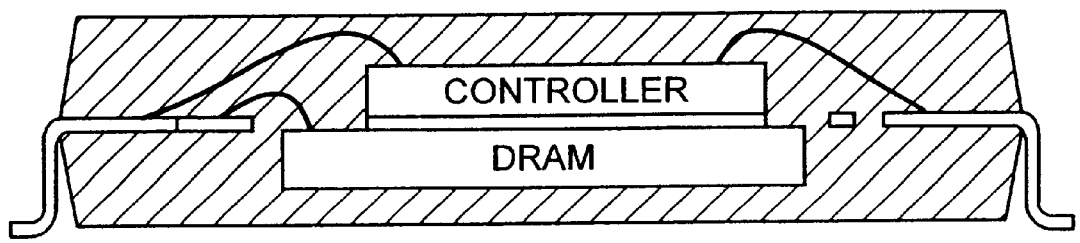
FIG. 18 is a diagram showing how the controller and the DRAM are incorporated into one package.

FIG. 18 shows an example of package containing a combination of a DRAM as a memory and a controller that executes the image processing.

Figure 19:
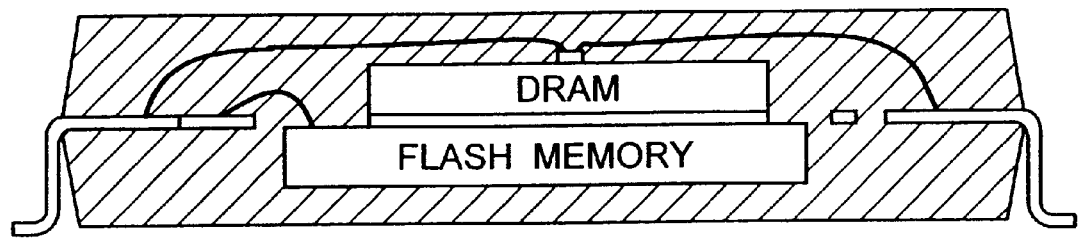
FIG. 19 is a diagram showing how the DRAM and the flash memory are incorporated into one package.

Further, FIG. 19 shows an example of package containing a combination of a DRAM and a flash memory. This type of package is expected to have growing demands in the future in such applications as cellular phones that require a large capacity of temporary memory for image communications.

In either of these packages the independent terminal arrangement according to this invention can be applied and the similar effects can be expected to be produced.

(Embodiment 7)

Figure 21:
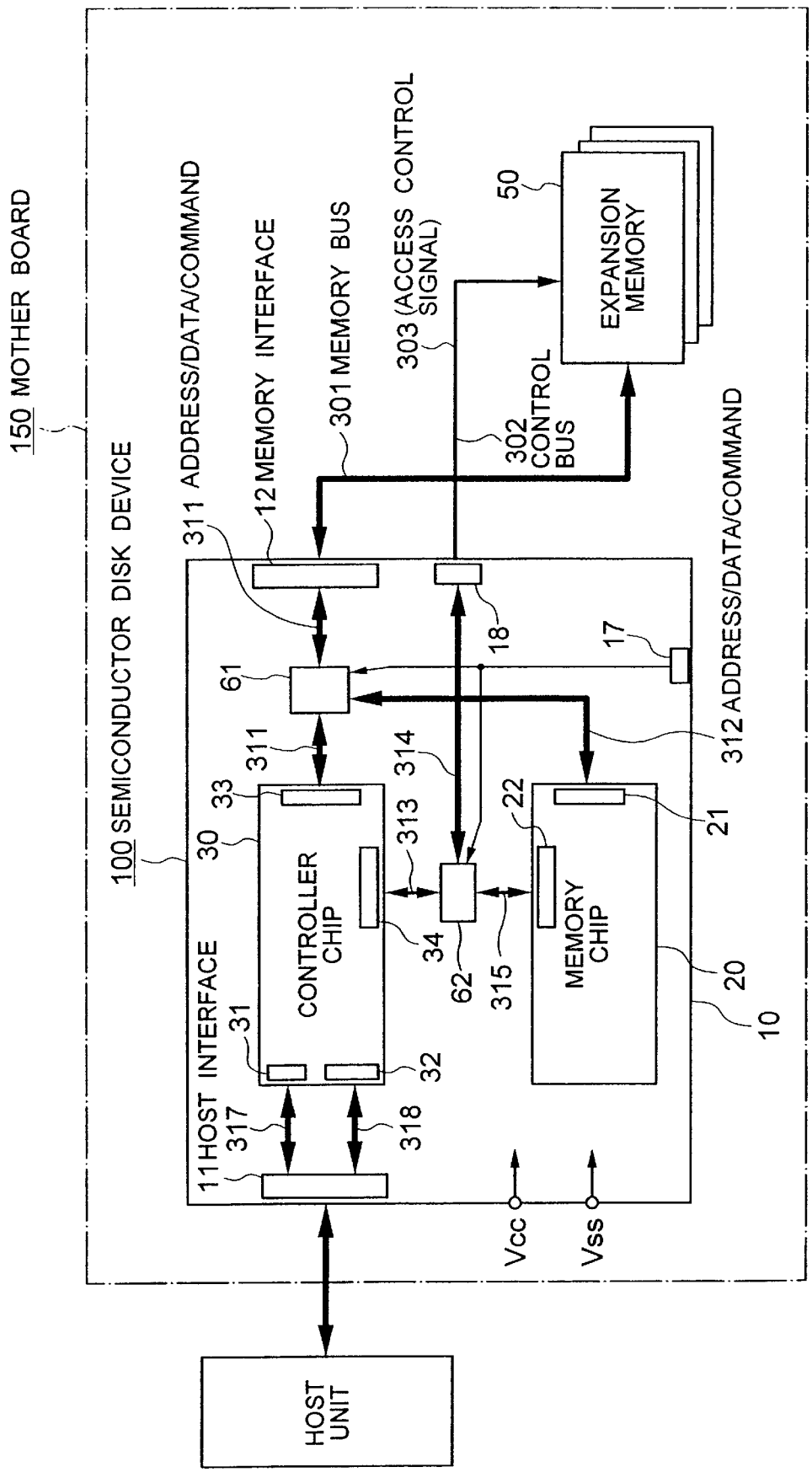
FIG. 21 is a block diagram of a semiconductor disk device with a built-in test selector.

FIG. 21 shows another example of the semiconductor disk device 100 alternative to the embodiment 1, which is designed to facilitate the testing of a plurality of chips accommodated in the semiconductor package 10. The semiconductor disk device 100 of the embodiment 7 has a test mode switching external terminal 17 formed in the semiconductor package 10 which receives a test mode switching signal from the external circuit. A plurality of chips 20, 30 in the semiconductor package 10 are internally connected and connection selectors 61, 62 are provided at intersections between the internal buses 311 and 312 and between the internal buses 313, 314 and 315.

When a test mode for the controller chip 30 is specified according to the test mode switching signal received from the external circuit, the selector 61 connects the controller chip 30 through the internal bus 311 to the external terminal 12 and disconnects the internal bus 312. At the same time, the selector 62 connects the internal buses 313 and 314 to connect the controller chip 30 to the external terminal 18.

When a test mode for the memory chip 20 is specified, the selector 61 connects the internal bus 311 on the external terminal 12 side to the internal bus 312 and disconnects the internal bus 311 on the controller side. The selector 62 connects the internal buses 314 and 315 to connect the memory chip 20 to the external terminal 18 and disconnects the internal bus 313.

With the test mode switched as described above, the controller chip 30 or memory chip 20 can be tested independently by the test system connected to the external terminals 12, 18. This produces the similar effect to that obtained when the chips in the embodiment 1 are connected independently to the external terminals and tested.

When the semiconductor disk device 100 of this embodiment is mounted on the mother board, a normal mode signal is input to the test mode switching external terminal 17. Based on the input signal, the selector 61 connects the internal buses 311, 312 and the selector 62 connects the internal buses 313, 314, 315. Then the controller chip 30 can access the expansion memory 50 connected to the external terminals 12, 18 in the same hierarchy as the built-in memory 20.

The connection selectors 61, 62 have a decoder to decode the test mode switching signal. The decoder has a built-in switch means to control the internal bus, which is to be disconnected, at a high output impedance. The connection selectors 61, 62 may be taken as a tri-state (3-state) output circuit arranged in each output circuit of the plurality of chips 20, 30.

Figure 22:
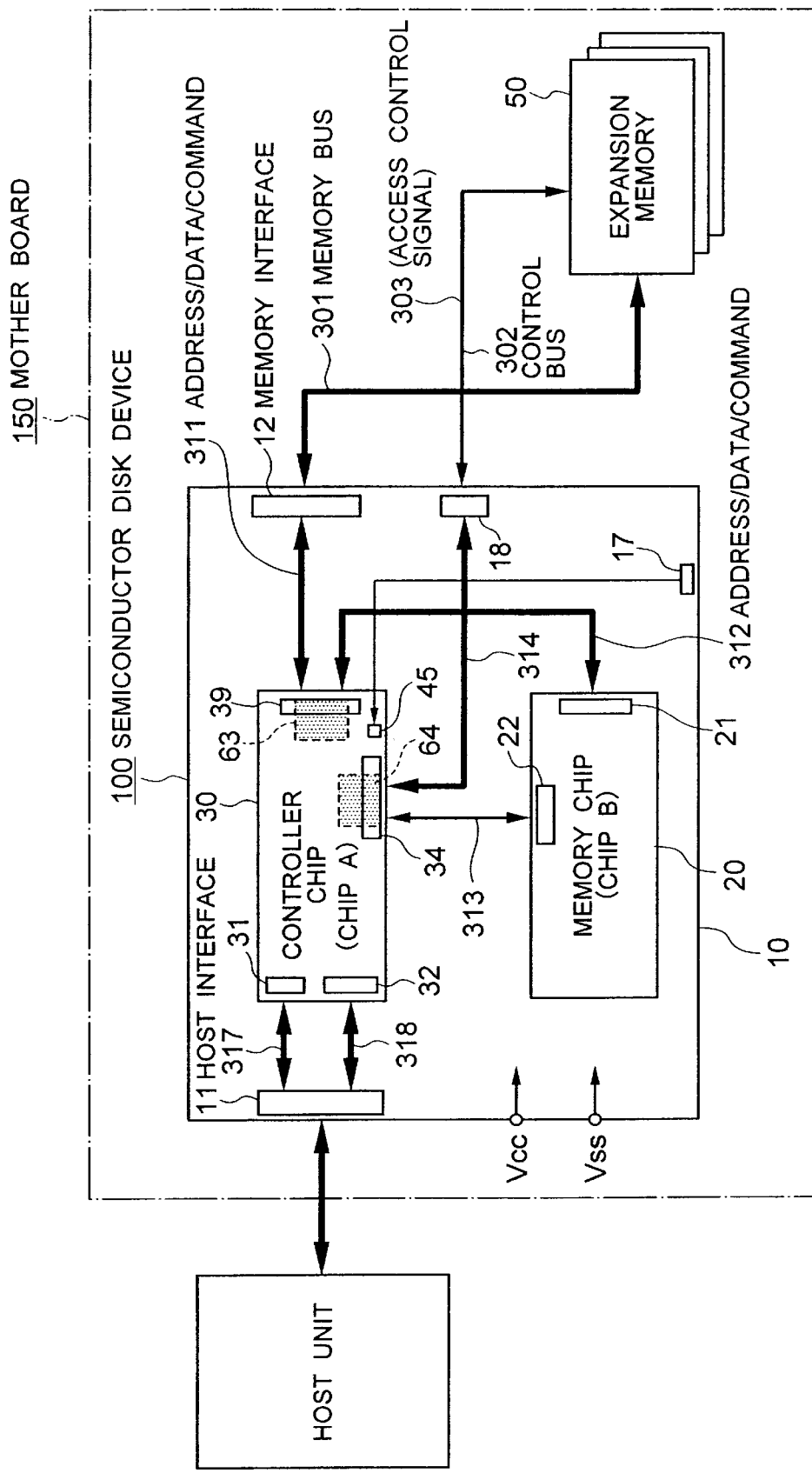
FIG. 22 is a block diagram of a semiconductor disk device incorporating a test selector in the controller chip.

As to the location in the semiconductor package 10 where the connection selectors 61, 62 are installed, they may be incorporated into the input/output terminal blocks of the controller chip 30. As shown in FIG. 22, the connection selectors 63, 64 are incorporated in the controller chip 30, connected to the input/output terminal blocks (electrode pads) 33, 34. Although the input/output terminal blocks 33, 34 are expected to have an increased number of electrode pads for connection with external terminals and the memory chip 20, they offer the advantage of being able to incorporate the connection selectors 63, 64 in the controller chip 30. The functions of the connection selectors 63, 64 are virtually the same as those of the connection selectors 61, 62 of FIG. 21, except that the connection selectors 63, 64 switch the connections to the internal circuits of the controller. The test mode switching signal is commonly entered into the electrode pad 45 of the controller 30.

In the embodiment shown in FIG. 22, examples of possible combinations of the chip A 30 and chip B 20 are shown in Table 3.

TABLE 3

| Chip A | Chip B |
|---|---|
| SRAM | Flash |
| SRAM | DRAM |
| Controller | Flash |
| Controller | DRAM |

The test mode switching signal terminal 22 shown in FIG. 21 and FIG. 22 need not be a dedicated external terminal but may not be provided when the test mode switching signal is replaced with a combination of a plurality of other signals.

Provision of the connection selectors 61, 62, 63, 64 in the semiconductor package 10 as described above allows the chips to be individually tested under their own test environments in the same way as they are tested in the semiconductor disk device 100 of the embodiment 1. The only difference is that the semiconductor disk device 100 of this embodiment can accommodate in the semiconductor package 10 the interconnecting wires 312, 313, 315 between a plurality of chips.

(Embodiment 8)

Figure 23:
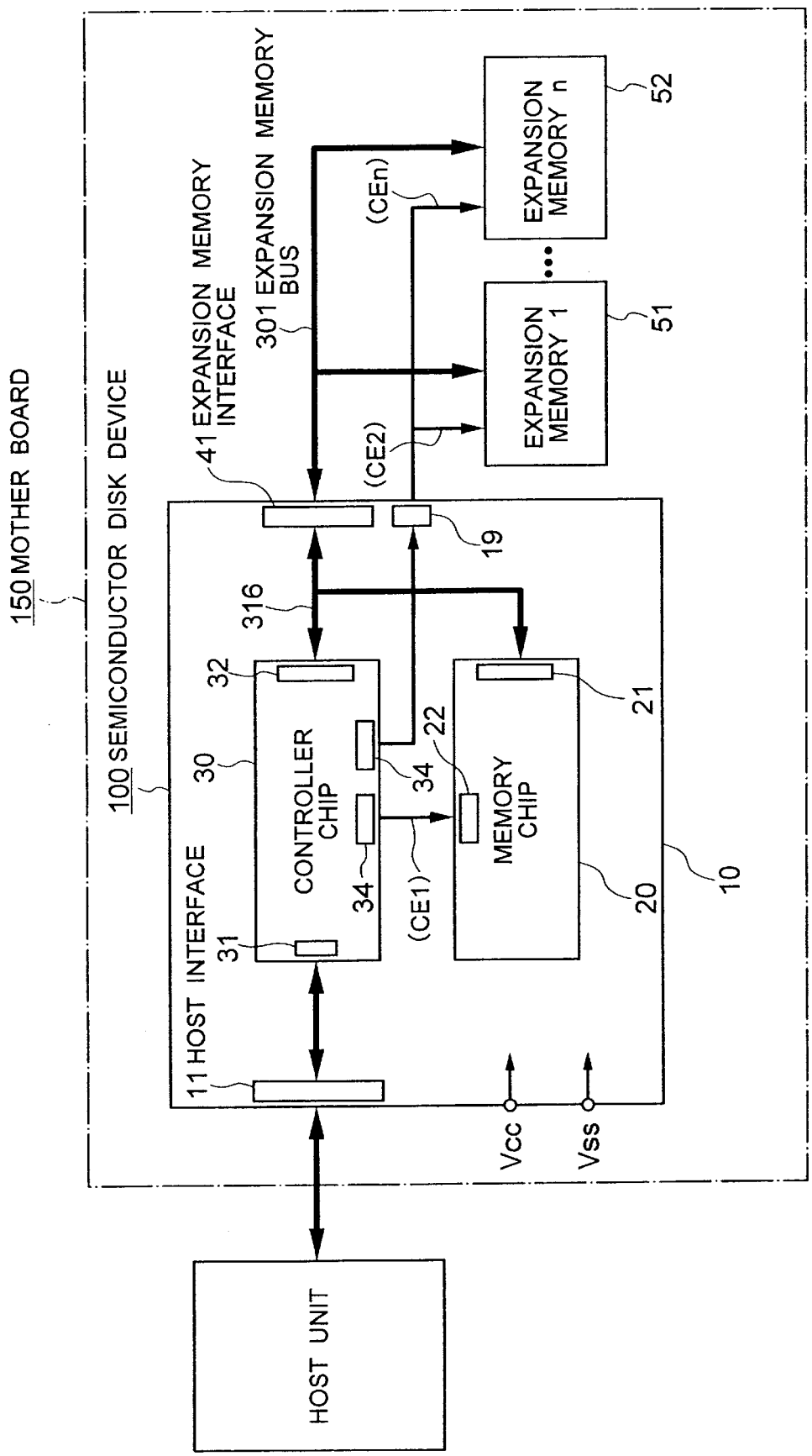
FIG. 23 is an embodiment in which an MCP has expansion terminals for expansion memories.

FIG. 23 shows a variation of the MCP type semiconductor disk device 100 explained in the embodiment 1 and 7. The semiconductor disk device 100 of this embodiment has internally connected between the controller 30 and the built-in memory 20 a signal path for a chip enable signal CE1 by which the controller 30 selects and activates the built-in memory 20. The controller 30 outputs through an external terminal 19 chip enable signals CE2, CEn for selecting the expansion memories 51, 52 mounted outside the semiconductor disk device 100. All other input/output signals necessary for the controller 30 to access the memory connect internally to the built-in memory 20 via the internal bus 316. The internal bus 316 connects to the expansion memory interface 41 so that the controller 30 can access the expansion memories 51, 52 via an expansion memory bus 301. While in the embodiment of FIG. 23 all other input/output signals internally connect to the built-in memory 20 through the internal bus 316, it is conceivable to have a part of these signals brought out to external terminals, through which the controller 30 and the built-in memory 20 are externally connected as required, as shown in the embodiment 1 of FIG. 1.

The difference between this embodiment and JP-A-6-250799 as prior art is that this embodiment is a semiconductor disk device constructed in the MCP configuration while the prior art is a semiconductor disk device constructed on a one-chip LSI. Another difference is that the expansion memory interface of this embodiment is the one that multiplexes address/data/command. If a part of the signals is brought out to the external terminals through which the controller 30 and the built-in memory 20 are externally connected as described above, the expansion memory interface 41 becomes an interface common to the expansion memories 51, 52 and the built-in memory 20. Thus, it is clearly different from the expansion memory interface of the prior art which is dedicated to only the expansion memory.

(Embodiment 9)

Figure 24:
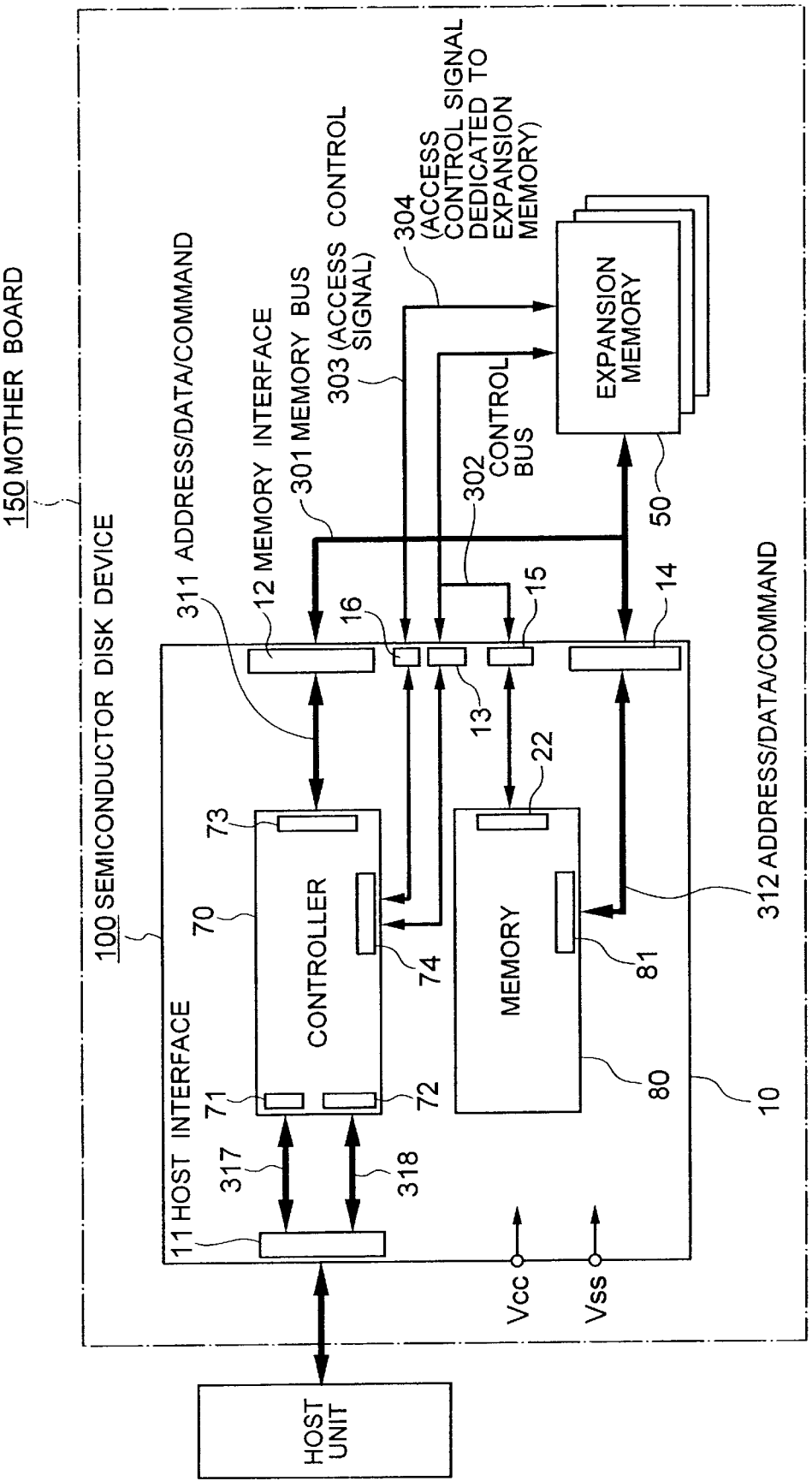
FIG. 24 is a block diagram showing a semiconductor disk device of this invention used as a system LSI.

FIG. 24 shows an example configuration of a single semiconductor disk LSI 60 incorporating a controller unit 70 and a memory unit 80. In the testing of LSI of such a configuration, too, it is considered appropriate to avoid the internal connection between the units as practicably as possible in order to perform the test on the individual units with high reliability. Hence, in the semiconductor disk LSI 60, the input/output blocks 73, 74, 81, 82 of the units 70, 80 are independently connected to the external terminals 12, 13, 14, 15, 16 of the semiconductor package 10 sealing the LSI chip, as in the embodiment 1. After this semiconductor disk LSI has been mounted on the board, the external terminals are connected on the board to form the semiconductor disk device. The controller unit 70 accesses the memory unit 80 through the external terminal (memory interface) 12, memory bus 301 and external terminal 14.

The difference between this embodiment and JP-A-6-250799 as prior art is that the controller and the memory mounted on a single LSI in this embodiment are not internally connected but externally connected on the board through external terminals of the semiconductor package 10. Hence, the memory interface 12 is common to the built-in memory 80 and the expansion memory and clearly differs from the interface of the prior art.

Rather than externally connecting all the signals between the controller unit 70 and the memory unit 80 as described above, only those signals whose internal connections between the units have large influences on the testing of individual units may be externally connected through the external terminals, with the other signals connected internally.

Some of the embodiments of the present invention described above may be summarized as follows.

EXAMPLE 1

A semiconductor device including a first semiconductor chip and a second semiconductor chip in a single package, the semiconductor device comprising:
  a selector installed in a signal internal connecting portion between the first semiconductor chip, the second semiconductor chip and external terminals of the package to switch an internal connection;
  a test mode input external terminal for inputting a test mode signal to the selector;
  a first test mode in which the selector, according to the test mode signal, independently connects input/output terminals of the first semiconductor chip to the external terminals of the package and disconnects the second semiconductor chip;
  a second test mode in which the selector, according to the test mode signal, independently connects input/output terminals of the second semiconductor chip to the external terminals of the package and disconnects the first semiconductor chip; and
  a normal mode in which the selector, according to a normal mode signal, internally connects the first semiconductor chip and the second semiconductor chip.

EXAMPLE 2

A semiconductor device according to example 1, wherein the selector is incorporated in an input/output terminal portion of the first semiconductor chip, and internal connections are made between the input/output terminals of the first semiconductor chip and the input/output terminals of the second semiconductor chip and between the input/output terminals of the first semiconductor chip and the external terminals of the package.

EXAMPLE 3

A semiconductor device according to example 1 or 2, wherein the test mode signal is replaced with a combination of a plurality of other signals and the test mode input external terminal is replaced with a plurality of other signal input external terminals.

EXAMPLE 4

A semiconductor device including a first semiconductor chip and a second semiconductor chip in a single package;
  wherein signal electrode pads of the first semiconductor chip are connected inside the package in a one-to-one relationship to first external terminals of the package;
  wherein signal electrode pads of the second semiconductor chip are connected inside the package in a one-to-one relationship to second external terminals of the package;
  wherein either a power supply terminal or a ground terminal is commonly connected to the first semiconductor chip and the second semiconductor chip.

EXAMPLE 5

A semiconductor device according to example 1 or 4, wherein the first semiconductor chip is mounted on the second semiconductor chip, with a surface (back surface) of the first semiconductor chip opposite its circuit forming surface securely bonded to a circuit forming surface of the second semiconductor chip, and a support lead of a lead frame is securely bonded to the circuit forming surface of the second semiconductor chip and sealed with a resin.

EXAMPLE 6

A semiconductor device according to any one of examples 1 to 5, wherein, of the external terminals independently connected to the input/output signal electrode pads of the first and second semiconductor chips, at least a pair of external terminals to be interconnected, one connected to the first semiconductor chip and one connected to the second semiconductor chip, is arranged so that these external terminals are set close to each other.

EXAMPLE 7

A semiconductor device comprising:
  a memory chip;
  a host interface having a plurality of input/output external terminals for connection with a host unit;
  a controller chip to access-control the memory chip according to a memory access request received from the host unit through the host interface;
  a plurality of first external terminals independently connected to input/output terminals of the controller chip for the controller chip to access the memory; and
  a plurality of second external terminals independently connected to input/output terminals of the memory chip for the memory chip to be accessed by the controller chip;
  wherein the first external terminals and the second external terminals are externally interconnected to allow the controller to access the memory.

EXAMPLE 8

A semiconductor device according to example 7, further including a plurality of third external terminals to input and output an access control signal for the controller chip to access-control an expansion memory connected outside the semiconductor device.

EXAMPLE 9

A semiconductor device according to example 7, wherein, of the external terminals connected to the address/data input/output electrode pads of the controller chip and the memory chip, at least a pair of external terminals to be interconnected, one connected to the controller chip and one connected to the memory chip, is arranged so that these external terminals are set close to each other.

EXAMPLE 10

A semiconductor disk device comprising:
  a semiconductor device mounted on a mother board, the semiconductor device having:
    a memory chip;
    a host interface having a plurality of input/output external terminals for connection with a host unit;
    a controller chip to access-control the memory chip according to a memory access request received from the host unit through the host interface;
    a plurality of first external terminals independently connected to input/output terminals of the controller chip for the controller chip to access the memory; and a plurality of second external terminals independently connected to input/output terminals of the memory chip for the memory chip to be accessed by the controller chip;

wherein the first external terminals and the second external terminals are interconnected by wires on the mother board.

EXAMPLE 11

A semiconductor device comprising a control unit and a memory unit in a single semiconductor chip;

wherein one signal output of the control unit and a first external terminal of the semiconductor chip are independently and internally interconnected;

wherein one signal input of the memory unit and a second external terminal of the semiconductor chip are independently and internally interconnected;

wherein the first and second external terminals of the semiconductor chip are interconnected outside the semiconductor chip to complete the connection between the signal output of the control unit and the signal input of the memory unit.

EXAMPLE 12

A semiconductor device having a control unit and a memory unit mounted in a single semiconductor chip;

wherein a path for inputting an output signal A of the control unit into the memory chip comprises:

a first part path connecting an output portion of the control unit and a first external terminal of the semiconductor chip;

a second part path connecting a second external terminal of the semiconductor chip and an input portion of the memory chip; and a third part path externally shortcircuit-connecting outside the semiconductor chip the first external terminal and the second external terminal of the semiconductor chip.

EXAMPLE 13

A semiconductor device according to example 11 or 12, wherein the control unit has an interface function to respond to an access from a host unit and an interface function to convert the access from the host unit into an access unique to the memory unit and access-control the memory unit.

EXAMPLE 14

A semiconductor device according to any one of examples 1 to 3, wherein the first semiconductor chip is an SRAM or a controller and the second semiconductor chip is a flash memory (block erase type EEPROM) or a DRAM.

EXAMPLE 15

A semiconductor device according to example 4, wherein when either the first or second semiconductor chip fails during a test, the failed semiconductor chip is taken out of service and only the remaining semiconductor chip is allowed to operate.

EXAMPLE 16

A semiconductor disk device comprising:

a semiconductor device having accommodated in a single package a memory chip, a host interface having a plurality of input/output external terminals for connection with a host unit, a controller chip to access-control the memory chip according to a memory access request received from the host unit through the host interface, and a memory interface having a plurality of input/output external terminals for the controller chip to access an external expansion memory;

a mother board on which to mount the semiconductor device; and an expansion memory connected to the memory interface of the semiconductor device.

EXAMPLE 17

A semiconductor disk device according to example 16, wherein the semiconductor device has a package structure in which the memory chip and the controller chip are stacked and sealed with resin.

EXAMPLE 18

A semiconductor disk device according to example 16, wherein the expansion memory is in the form of a package mounted on the mother board, the package incorporating a plurality of memory chips stacked and sealed with resin.

As explained in the above example embodiments, a plurality of kinds of semiconductor chips are accommodated in a single package to reduce the mounting area. Further, the internal connection among the chips inside the package is precluded as practically as possible and the terminals (electrode pads) of the chips are independently connected to the external terminals of the package. When the chips in the package are tested, this arrangement eliminates influences of signals from other chips than the one being tested and influences of leakage currents. It is therefore possible to provide an environment under which the individual chips can be tested independently. As a result, the existing test system which was originally developed for the individual chip testing can be used as is or with only a slight modification. Hence, performing the test on the chips individually can guarantee the reliability of the test. This in turn eliminates the need to develop a new test system, keeping the product development TAT and cost low.

As a variation of this invention, it is possible to provide a test selector in the package and to select a desired internal connection according to a mode signal to test the chips independently. In this test method, too, the test system originally developed for the individual chip testing can be used with the similar effects. In this case, however, the selector needs to be installed on the internal wires inside the package, or in the controller chip.

What is claimed is:

1. A-semiconductor device comprising:

a first semiconductor chip having a first insulating adhesive layer formed over its back surface;

an insulating substrate or insulating film having an interconnect layer formed over its front surface and mounting external terminals formed over a back surface and electrically connected to the interconnect layer, the insulating substrate having the first semiconductor chip mounted on the front surface thereof with the first insulating adhesive layer therebetween; and a second semiconductor chip having a second insulating adhesive layer formed over a back surface thereof, the second semiconductor chip being mounted on a circuit forming surface of the first semiconductor chip with the second insulating adhesive layer therebetween, the first and second semiconductor chips each having at least one electrode pad connected through wires to electrode portions of the interconnect layer; and a resin body sealing connecting portions connected by the wires;

wherein an output signal A from one of the first or second semiconductor chips is output to a first one of the external terminals, and a second one of the external terminals is connected to the electrode pad of the other of the first or second semiconductor chips, wherein the signal A is input to the second external terminal.

2. A semiconductor device according to claim 1, wherein the first semiconductor chip is a controller chip and the second semiconductor chip is a memory chip.

3. A semiconductor device according to claim 2, wherein the controller chip has an interface function to respond to an access from a host unit and an interface function to convert the access from the host unit into an access unique to the memory chip and thereby access-control the memory chip.

4. A semiconductor device according to claim 3, wherein the controller chip further includes a function to write data into the memory chip by adding an error correction code to the data and to recover the data from the memory chip by performing error correction processing on the data read from the memory chip.

5. A semiconductor device according to claim 3, wherein the controller chip further includes a function to write data requiring security into the memory chip by performing encryption processing on the data and to perform decryption processing on the data read from the memory chip.

6. A semiconductor device according to claim 1, wherein the signal electrode pads of the first semiconductor chip and the second semiconductor chip are connected inside the package in a one-to-one relationship to the external terminals of the package; and wherein the first external terminal of the package that outputs an output signal A from one of the first and second semiconductor chip and the second external terminal of the package that inputs the signal A and is connected to the electrode pad of the other semiconductor chip are arranged close to each other in the package.

7. A semiconductor device according to claim 1, wherein the first and second external terminals are adjacent external terminals arranged close to a central portion of the insulating substrate or insulating film.

8. A semiconductor device having a first semiconductor chip and a second semiconductor chip in a single package; wherein a signal A output terminal of the first semiconductor chip and a first external terminal of the semiconductor device are internally connected in the package without being connected to others;

wherein a signal A output terminal of the second semiconductor chip and a second external terminal of the semiconductor device are internally connected in the package without being connected to others; and wherein the first and second external terminals are externally shortcircuit-connected outside the semiconductor device to complete the connection of the signal A between the first and second semiconductor chips.

9. A semiconductor device according to claim 8, wherein the first semiconductor chip is a controller chip and the second semiconductor chip is a memory chip.

10. A semiconductor device according to claim 9, wherein the controller chip has an interface function to respond to an access from the host unit and an interface function to convert the access from the host unit into an access unique to the memory chip and thereby access-control the memory chip.

11. A semiconductor device according to claim 10, wherein the controller chip further includes a function to write data into the memory chip by adding an error correction code to the data and to recover the data from the memory chip by performing error correction processing on the data read from the memory chip.

12. A semiconductor device according to claim 10, wherein the controller chip further includes a function to write data requiring security into the memory chip by performing encryption processing on the data and to perform decryption processing on the data read from the memory chip.

13. A semiconductor device according to claim 8, wherein
the first semiconductor chip has a plurality of electrode pads formed over a circuit forming surface (front surface) of a square semiconductor substrate, and
the second semiconductor chip has a plurality of electrode pads formed over a circuit forming surface of a square semiconductor substrate larger in size than the semiconductor substrate of the first semiconductor chip, the semiconductor device further including:
a plurality of leads arranged around outer peripheral sides of the first and second semiconductor chips, each of the leads having an inner portion and an outer portion, the inner portions being electrically connected through conductive wires to electrode pads of the first and second semiconductor chips;
a support lead for supporting the second semiconductor chip; and
a resin sealing body sealing the first and second semiconductor chips, the wires and the inner portions of the leads.

14. A semiconductor device according to claim 13, wherein
the first semiconductor chip is mounted on the second semiconductor chip, with a surface (back surface) opposite the circuit forming surface of the first semiconductor chip securely bonded to the circuit forming surface of the second semiconductor chip, and
the support lead is securely bonded to the circuit forming surface of the second semiconductor chip.

15. A semiconductor device according to claim 13, wherein the first semiconductor chip is set larger in thickness than the second semiconductor chip.

16. A semiconductor device according to claim 13, wherein the plurality of electrode pads formed on the circuit forming surface of the second semiconductor chip are arranged in one column.

17. A semiconductor device according to claim 8,
wherein the first semiconductor chip has a first insulating adhesive layer formed over the back surface thereof;
wherein the first semiconductor chip is mounted on an insulating substrate with the first insulating adhesive layer therebetween, the insulating substrate having an interconnect layer formed over its front surface and mounting external terminals formed over its back surface and electrically connected through via holes to the interconnect layer;
wherein the second semiconductor chip has a second insulating adhesive layer formed over its back surface;
wherein the second semiconductor chip is mounted on the circuit forming surface of the first semiconductor chip with the second insulating adhesive layer therebetween;

wherein electrode pads of the first semiconductor chip and the second semiconductor chip are connected to electrode portions of the interconnect layer through wires; and wherein the first semiconductor chip, the second semiconductor chip and the wires are sealed with resin.

18. A semiconductor device according to claim 8, wherein the first semiconductor chip and the second semiconductor chip are mounted on an upper surface or lower surface of a circuit board or a support lead, the semiconductor device further including:
- a plurality of leads arranged around outer peripheral sides of the first and second semiconductor chips, each of the leads having an inner portion and an outer portion, the inner portions being electrically connected through conductive wires to electrode pads of the first and second semiconductor chips; and
- a resin sealing body sealing the first and second semiconductor chips, the circuit board or support lead, the wires and the inner portions of the leads.

19. A semiconductor device according to claim 8, wherein the second semiconductor chip is a memory chip;

wherein the first semiconductor chip is a controller chip that access-controls the memory chip in response to a memory access request received from a host unit through an interface, the interface having a plurality of first input/output external terminals for connection with the host unit;

wherein signal input/output terminals of the controller chip for the controller chip to access the memory chip are independently and internally connected to a plurality of second external terminals;

wherein signal input/output terminals of the memory chip for the memory chip to be accessed by the controller chip are independently and internally connected to a plurality of third external terminals; and wherein the second external terminals and the third external terminals are shortcircuit-connected on the board to allow the controller chip to access the memory chip.

20. A semiconductor chip according to claim 19, further including a plurality of third external terminals that input and output an access control signal for the controller chip to access-control an expansion memory connected outside the semiconductor device.

21. A semiconductor device according to claim 19, wherein a program to be executed when the controller chip access-controls the memory chip is stored in the memory chip in advance.

22. A semiconductor device according to claim 19, wherein the external terminals are connected in a one-to-one relationship to input/output electrode pads of the controller chip and the memory chip for address, data and access control signals; and wherein, of these external terminals, at least a pair of external terminals to be interconnected, one connected to the controller chip and one connected to the memory chip, is arranged so that these external terminals are set close to each other.

23. A semiconductor device according to claim 8, wherein the first semiconductor chip is a DRAM chip and the second semiconductor chip is a flash memory.

24. A semiconductor device according to claim 8, wherein the signal electrode pads of the first semiconductor chip and the second semiconductor chip are connected inside the package in a one-to-one relationship to the external terminals of the package; and wherein the first external terminal of the package that outputs an output signal A from one of the first and second semiconductor chip and the second external terminal of the package that inputs the signal A and is connected to the electrode pad of the other semiconductor chip are arranged close to each other in the package.

25. A semiconductor device having a first semiconductor chip and a second semiconductor chip mounted in a single package;

wherein a path for inputting an output signal A of the first semiconductor chip into the second semiconductor chip comprises:
- a first part path connecting an output terminal of the first semiconductor chip and a first external terminal of the package;
- a second part path connecting a second external terminal of the package and an input terminal of the second semiconductor chip; and
- a third part path externally shortcircuit-connecting outside the package the first external terminal and the second external terminal of the package.

26. A semiconductor device according to claim 25, wherein the first semiconductor chip is a controller chip and the second semiconductor chip is a memory chip.

27. A semiconductor device according to claim 26, wherein the controller chip has an interface function to respond to an access from the host unit and an interface function to convert the access from the host unit into an access unique to the memory chip and thereby access-control the memory chip.

28. A semiconductor device according to claim 27, wherein the controller chip further includes a function to write data into the memory chip by adding an error correction code to the data and to recover the data from the memory chip by performing error correction processing on the data read from the memory chip.

29. A semiconductor device according to claim 27, wherein the controller chip further includes a function to write data requiring security into the memory chip by performing encryption processing on the data and to perform decryption processing on the data read from the memory chip.

30. A semiconductor device according to claim 25, wherein the first semiconductor chip has a plurality of electrode pads formed over a circuit forming surface (front surface) of a square semiconductor substrate, and the second semiconductor chip has a plurality of electrode pads formed over a circuit forming surface of a square semiconductor substrate larger in size than the semiconductor substrate of the first semiconductor chip, the semiconductor device further including:
- a plurality of leads arranged around outer peripheral sides of the first and second semiconductor chips, each of the leads having an inner portion and an outer portion, the inner portions being electrically connected through conductive wires to electrode pads of the first and second semiconductor chips;
- a support lead for supporting the second semiconductor chip; and
- a resin sealing body sealing the first and second semiconductor chips, the wires and the inner portions of the leads.

31. A semiconductor device according to claim 30, wherein the first semiconductor chip is mounted on the second semiconductor chip, with the surface (back surface)

opposite the circuit forming surface of the first semiconductor chip securely bonded to the circuit forming surface of the second semiconductor chip, and the support lead is securely bonded to the circuit forming surface of the second semiconductor chip.

32. A semiconductor device according to claim 30, wherein the first semiconductor chip is set larger in thickness than the second semiconductor chip.

33. A semiconductor device according to claim 30, wherein the plurality of electrode pads formed on the circuit forming surface of the second semiconductor chip are arranged in one column.

34. A semiconductor device according to claim 25, wherein the first semiconductor chip has a first insulating adhesive layer formed over the back surface thereof;

wherein the first semiconductor chip is mounted on an insulating substrate with the first insulating adhesive layer therebetween, the insulating substrate having an interconnect layer formed over its front surface and mounting external terminals formed over its back surface and electrically connected through via holes to the interconnect layer;

wherein the second semiconductor chip has a second insulating adhesive layer formed over its back surface;

wherein the second semiconductor chip is mounted on the circuit forming surface of the first semiconductor chip with the second insulating adhesive layer therebetween;

wherein electrode pads of the first semiconductor chip and the second semiconductor chip are connected to electrode portions of the interconnect layer through wires; and wherein the first semiconductor chip, the second semiconductor chip and the wires are sealed with resin.

35. A semiconductor device according to claim 25, wherein the first semiconductor chip and the second semiconductor chip are mounted on an upper surface or lower surface of a circuit board or a support lead, the semiconductor device further including:

a plurality of leads arranged around outer peripheral sides of the first and second semiconductor chips, each of the leads having an inner portion and an outer portion, the inner portions being electrically connected through conductive wires to electrode pads of the first and second semiconductor chips; and a resin sealing body sealing the first and second semiconductor chips, the circuit board or support lead, the wires and the inner portions of the leads.

36. A semiconductor device according to claim 25, wherein the second semiconductor chip is a memory chip;

wherein the first semiconductor chip is a controller chip that access-controls the memory chip in response to a memory access request received from a host unit through an interface, the interface having a plurality of first input/output external terminals for connection with the host unit;

wherein signal input/output terminals of the controller chip for the controller chip to access the memory chip are independently and internally connected to a plurality of second external terminals;

wherein signal input/output terminals of the memory chip for the memory chip to be accessed by the controller chip are independently and internally connected to a plurality of third external terminals; and wherein the second external terminals and the third external terminals are shortcircuit-connected on the board to allow the controller chip to access the memory chip.

37. A semiconductor chip according to claim 36, further including a plurality of third external terminals that input and output an access-control signal for the controller chip to access-control an expansion memory connected outside the semiconductor device.

38. A semiconductor device according to claim 36, wherein a program to be executed when the controller chip access-controls the memory chip is stored in the memory chip in advance.

39. A semiconductor device according to claim 36, wherein the external terminals are connected in a one-to-one relationship to input/output electrode pads of the controller chip and the memory chip for address, data and access control signals; and wherein, of these external terminals, at least a pair of external terminals to be interconnected, one connected to the controller chip and one connected to the memory chip, is arranged so that these external terminals are set close to each other.

40. A semiconductor device according to claim 25, wherein the first semiconductor chip is a DRAM chip and the second semiconductor chip is a flash memory.

41. A semiconductor device according to claim 25, wherein the signal electrode pads of the first semiconductor chip and the second semiconductor chip are connected inside the package in a one-to-one relationship to the external terminals of the package; and wherein the first external terminal of the package that outputs an output signal A from one of the first and second semiconductor chip and the second external terminal of the package that inputs the signal A and is connected to the electrode pad of the other semiconductor chip are arranged close to each other in the package.

* * * * *